US012560485B2

(12) United States Patent
Wang et al.

(10) Patent No.: US 12,560,485 B2
(45) Date of Patent: Feb. 24, 2026

(54) METHOD AND SYSTEM FOR INSPECTING COOLING HOLES OF A TURBINE ENGINE COMPONENT

(71) Applicant: GENERAL ELECTRIC COMPANY, Schenectady, NY (US)

(72) Inventors: Guanghua Wang, Clifton Park, NY (US); Bryon Edward Knight, Ballston Lake, NY (US); Andrew Lee Trimmer, Niskayuna, NY (US); Jason Edward Dees, Liberty Township, OH (US); Bernard Patrick Bewlay, Niskayuna, NY (US); Sean Robert Farrell, Brookline, MA (US)

(73) Assignee: General Electric Company, Evendale, OH (US)

( * ) Notice: Subject to any disclaimer, the term of this patent is extended or adjusted under 35 U.S.C. 154(b) by 0 days.

(21) Appl. No.: 18/537,983

(22) Filed: Dec. 13, 2023

(65) Prior Publication Data

US 2024/0118140 A1    Apr. 11, 2024

Related U.S. Application Data

(63) Continuation of application No. 16/934,386, filed on Jul. 21, 2020, now Pat. No. 11,885,688.

(51) Int. Cl.
*G01J 5/00* (2022.01)
*F01D 21/00* (2006.01)
(Continued)

(52) U.S. Cl.
CPC .......... *G01J 5/0088* (2013.01); *F01D 21/003* (2013.01); *G01J 5/0022* (2013.01);
(Continued)

(58) Field of Classification Search
CPC ........ G01J 5/0088; G01J 5/0022; G01J 5/027; G01J 5/48; G01J 2005/0077;
(Continued)

(56) References Cited

U.S. PATENT DOCUMENTS

| | | |
|---|---|---|
| 4,644,162 A | 2/1987 | Bantel et al. |
| 4,902,139 A | 2/1990 | Adiutori |

(Continued)

FOREIGN PATENT DOCUMENTS

| | | |
|---|---|---|
| DE | 102009039224 A1 | 3/2011 |
| EP | 1416266 B1 | 9/2006 |

(Continued)

*Primary Examiner* — John E Breene
*Assistant Examiner* — Janice M Soto
(74) *Attorney, Agent, or Firm* — Hanley, Flight & Zimmerman, LLC

(57) ABSTRACT

A method of imaging a turbine engine test component with a first surface and a second surface that is spaced from the first surface. The turbine engine test component includes a plurality of film holes with inlets formed in the second surface or interior that are fluidly coupled to outlets formed in the first surface or exterior. The method includes flowing airflow through the plurality of film holes of the turbine engine test component, obtaining thermographic data, determining a test dataset, and calculating a performance score.

20 Claims, 9 Drawing Sheets

(51) Int. Cl.

| | | |
|---|---|---|
| *G01J 5/02* | (2022.01) | |
| *G01J 5/48* | (2022.01) | |
| *G01N 25/18* | (2006.01) | |
| *G01R 23/02* | (2006.01) | |

(52) U.S. Cl.
CPC ........ *G01J 5/027* (2013.01); *F05D 2270/303* (2013.01); *F05D 2270/804* (2013.01); *G01J 2005/0077* (2013.01); *G01J 5/48* (2013.01); *G01N 25/18* (2013.01); *G01R 23/02* (2013.01)

(58) Field of Classification Search
CPC ........ F01D 21/003; F01D 5/005; F01D 5/186; F01D 21/14; F01D 25/00; F05D 2270/303; F05D 2270/804; F05D 2230/80; F05D 2270/334; F05D 2220/32; F05D 2270/8041; F05D 2260/202; G01N 25/18; G01N 25/72; G01R 23/02; Y02T 50/60
See application file for complete search history.

(56) References Cited

U.S. PATENT DOCUMENTS

| | | | |
|---|---|---|---|
| 4,916,715 | A | 4/1990 | Adiutori |
| 4,978,230 | A | 12/1990 | Adiutori et al. |
| 4,983,836 | A | 1/1991 | Matoba et al. |
| 5,111,046 | A | 5/1992 | Bantel |
| 5,773,790 | A | 6/1998 | Moore et al. |
| 6,422,743 | B1 | 7/2002 | Nirmalan et al. |
| 6,570,175 | B2 | 5/2003 | Bales et al. |
| 6,704,688 | B2 * | 3/2004 | Aslam ................ G05B 23/0229 702/182 |
| 6,711,506 | B2 | 3/2004 | Bales et al. |
| 6,750,454 | B2 | 6/2004 | Brown et al. |
| 6,804,622 | B2 | 10/2004 | Bunker et al. |
| 7,075,083 | B2 | 7/2006 | Beyer |
| 8,287,183 | B2 | 10/2012 | Shepard et al. |
| 8,810,644 | B2 | 8/2014 | Bunker et al. |
| 9,080,453 | B2 | 7/2015 | Shepard et al. |
| 9,182,318 | B2 | 11/2015 | McCaldon |
| 9,250,134 | B2 | 2/2016 | Shepard et al. |
| 9,341,586 | B2 | 5/2016 | Henderkott et al. |
| 9,347,899 | B2 | 5/2016 | Henderkott et al. |
| 9,400,256 | B2 | 7/2016 | Henderkott et al. |
| 10,048,133 | B2 | 8/2018 | Smith et al. |
| 10,104,313 | B2 | 10/2018 | Slavens et al. |
| 10,152,784 | B2 | 12/2018 | Nalladega et al. |
| 2004/0037344 | A1 | 2/2004 | Bunker et al. |
| 2007/0290134 | A1 | 12/2007 | Key et al. |
| 2008/0237466 | A1 | 10/2008 | Key |
| 2009/0016402 | A1 * | 1/2009 | Bunker .................. G01N 25/72 374/43 |
| 2009/0255332 | A1 | 10/2009 | Bunker et al. |
| 2009/0297336 | A1 | 12/2009 | Allen et al. |
| 2010/0250155 | A1 | 9/2010 | Bunker et al. |
| 2011/0048117 | A1 | 3/2011 | Kell et al. |
| 2011/0125423 | A1 | 5/2011 | Allen et al. |
| 2011/0164653 | A1 | 7/2011 | Allen et al. |
| 2011/0235672 | A1 | 9/2011 | Shepard et al. |
| 2013/0041614 | A1 | 2/2013 | Shepard et al. |
| 2014/0208768 | A1 | 7/2014 | Bacic |
| 2014/0300729 | A1 | 10/2014 | Drescher et al. |
| 2015/0033836 | A1 | 2/2015 | McCaldon |
| 2016/0177772 | A1 * | 6/2016 | Smith ................... G01J 5/0037 415/118 |
| 2018/0013959 | A1 | 1/2018 | Slavens et al. |
| 2019/0317025 | A1 * | 10/2019 | Nayeri ................... F01D 5/189 |

FOREIGN PATENT DOCUMENTS

| | | | |
|---|---|---|---|
| FR | 2630209 | A1 | 10/1989 |
| WO | 1993022663 | A1 | 11/1993 |
| WO | 2003038238 | A2 | 5/2003 |

* cited by examiner

METHOD AND SYSTEM FOR INSPECTING COOLING HOLES OF A TURBINE ENGINE COMPONENT

CROSS-REFERENCE TO RELATED APPLICATION

This application is a continuation application of U.S. patent application Ser. No. 16/934,386, filed Jul. 21, 2020, now U.S. Pat. No. 11,885,688, which is hereby incorporated herein by reference in its entirety.

TECHNICAL FIELD

This disclosure relates to a method of imaging a turbine engine component using a thermographic sensor.

BACKGROUND

Components of turbine engines, for example, turbine blades, can be exposed to extremely hot temperatures during operation of the engines. These blades can be provided with cooling holes that permit and direct the flow of a cooling fluid, such as cooler air, through and/or outside of the turbine blades. This cooling fluid can be directed outside of the blades by the cooling holes to provide a thermally protective film of air forming a barrier that prevents the blades from becoming too hot. Without the cooling holes and proper airflow through the cooling holes, the life cycle of the turbine blades can be shortened.

BRIEF DESCRIPTION

Aspects and advantages of the disclosure will be set forth in part in the following description, or may be obvious from the description, or may be learned through practice of the disclosure herein.

Aspects of the present disclosure relates to a method of imaging a turbine engine component having a first surface and second surface spaced from the first surface, and a plurality of holes with inlets formed in the second surface fluidly coupled to outlets formed in the first surface, the method comprising determining at least one fluid frequency corresponding to at least one portion of the turbine engine component, determining, based on the at least one fluid frequency, at least one sampling frequency, pulsing fluid at the at least one fluid frequency through at least a portion of the plurality of holes of the turbine engine component, imaging, during the pulsing of the fluid, the at least one portion of the turbine engine component using a thermographic sensor that captures images at the at least one sampling frequency, and storing the images captured by the thermographic sensor.

These and other features, aspects and advantages of the present disclosure will become better understood with reference to the following description and appended claims. The accompanying drawings, which are incorporated in and constitute a part of this specification, illustrate aspects of the disclosure and, together with the description, serve to explain the principles of the disclosure.

BRIEF DESCRIPTION OF THE DRAWINGS

A full and enabling disclosure, including the best mode thereof, directed to one of ordinary skill in the art, is set forth in the specification, which refers to the appended figures in which.

In the drawings.

DETAILED DESCRIPTION

Figure 1:
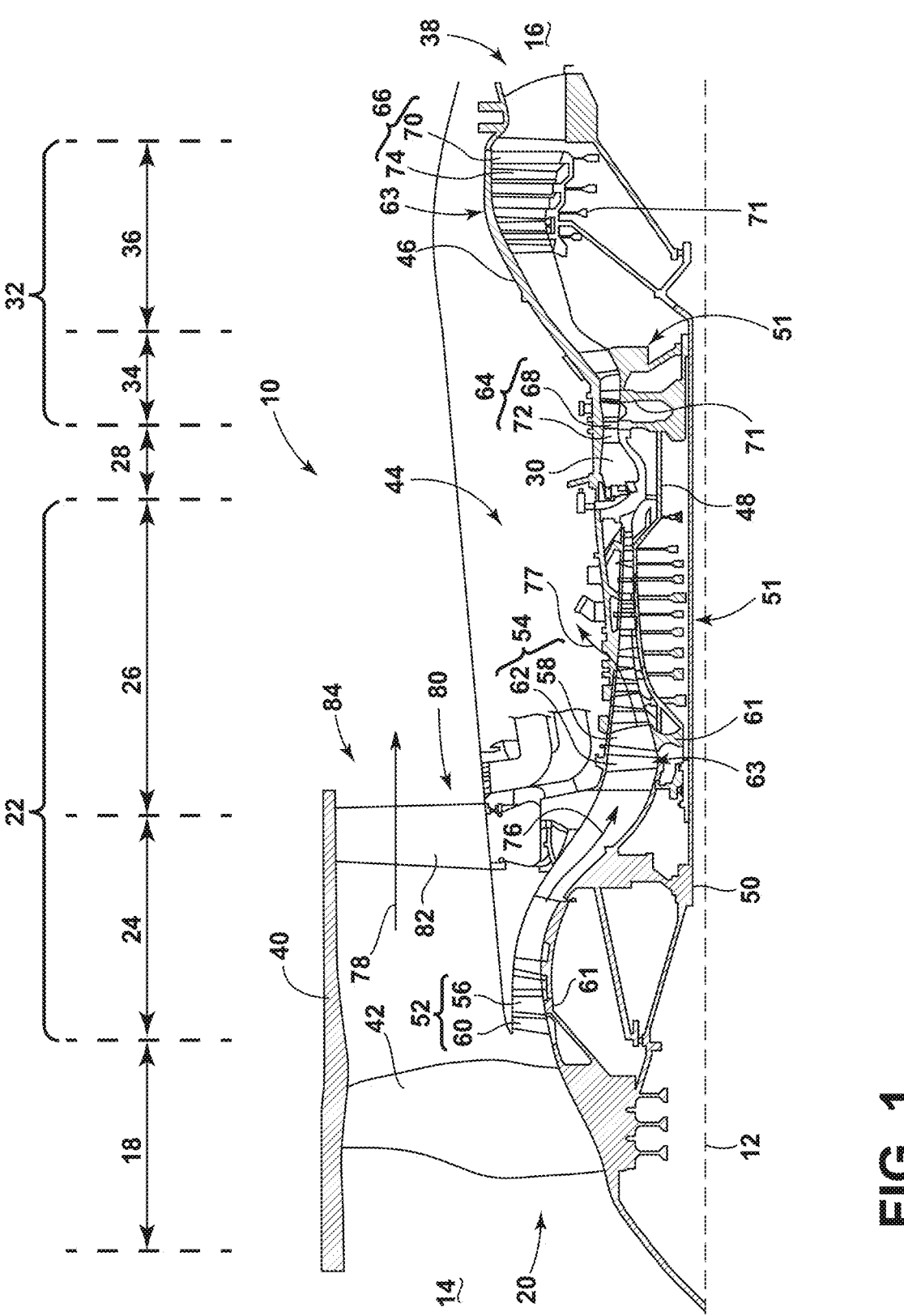
FIG. 1 is a schematic, sectional view of a gas turbine engine.

One or more aspects described herein provide a method for imaging a component of a turbine engine. The method can include determining at least one fluid frequency at which to pulse fluid through the component of the turbine engine. Further, the method can include imaging, during the pulsing of the fluid, the turbine engine component using a thermographic sensor that captures images at the at least one sampling frequency. The captured images can then be stored.

One or more aspects described herein provide a method for determining a performance score for a component of a turbine engine. The performance score can be determined by comparing a test dataset to a reference dataset, where the test and reference datasets are obtained by an inspection system. The inspection system uses a method that obtains and processes thermographic image data to provide fluid flow illustrated as airflow values for each cooling hole or a set of cooling holes, where the airflow values for each component can be combined to form the test dataset or the reference dataset. The calculated performance score can be compared to predetermined threshold values to determine if the turbine engine component is overperforming, acceptably performing, or underperforming. Manufacturing of the turbine engine component can be altered based on the performance score of the turbine engine component.

As used herein, the term "upstream" refers to a direction that is opposite the fluid flow direction, and the term "downstream" refers to a direction that is in the same direction as the fluid flow. The term "fore" or "forward" means in front of something and "aft" or "rearward" means behind something. For example, when used in terms of fluid flow, fore/forward can mean upstream and aft/rearward can mean downstream.

Additionally, as used herein, the terms "radial" or "radially" refer to a direction away from a common center. For example, in the overall context of a turbine engine, radial refers to a direction along a ray extending between a center longitudinal axis of the engine and an outer engine circumference. Furthermore, as used herein, the term "set" or a "set" of elements can be any number of elements, including only one.

Additionally, as used herein, a "controller" or "module" can include a component configured or adapted to provide instruction, control, operation, or any form of communication for operable components to effect the operation thereof. A module or controller module can include any known processor, microcontroller, or logic device, including, but not limited to: field programmable gate arrays (FPGA), an application specific integrated circuit (ASIC), a full authority digital engine control (FADEC), a proportional controller (P), a proportional integral controller (PI), a proportional derivative controller (PD), a proportional integral derivative controller (PID controller), a hardware-accelerated logic controller (e.g. for encoding, decoding, transcoding, etc.), the like, or a combination thereof. Non-limiting examples of a controller module can be configured or adapted to run, operate, or otherwise execute program code to effect operational or functional outcomes, including carrying out various methods, functionality, processing tasks, calculations, comparisons, sensing or measuring of values, or the like, to enable or achieve the technical operations or operations described herein. The operation or functional outcomes can be based on one or more inputs, stored data values, sensed or measured values, true or false indications, or the like. While "program code" is described, non-limiting examples of operable or executable instruction sets can include routines, programs, objects, components, data structures, algorithms, etc., that have the technical effect of performing particular tasks or implement particular abstract data types. In another non-limiting example, a controller module can also include a data storage component accessible by the processor, including memory, whether transient, volatile or non-transient, or non-volatile memory. Additional non-limiting examples of the memory can include Random Access Memory (RAM), Read-Only Memory (ROM), flash memory, or one or more different types of portable electronic memory, such as discs, DVDs, CD-ROMs, flash drives, universal serial bus (USB) drives, the like, or any suitable combination of these types of memory. In one example, the program code can be stored within the memory in a machine-readable format accessible by the processor. Additionally, the memory can store various data, data types, sensed or measured data values, inputs, generated or processed data, or the like, accessible by the processor in providing instruction, control, or operation to effect a functional or operable outcome, as described herein.

Additionally, as used herein, elements being "electrically connected," "electrically coupled," or "in signal communication" can include an electric transmission or signal being sent, received, or communicated to or from such connected or coupled elements. Furthermore, such electrical connections or couplings can include a wired or wireless connection, or a combination thereof.

Also, as used herein, while sensors can be described as "sensing" or "measuring" a respective value, sensing or measuring can include determining a value indicative of or related to the respective value, rather than directly sensing or measuring the value itself. The sensed or measured values can further be provided to additional components. For instance, the value can be provided to a controller module or processor as defined above, and the controller module or processor can perform processing on the value to determine a representative value or an electrical characteristic representative of said value.

All directional references (e.g., radial, axial, proximal, distal, upper, lower, upward, downward, left, right, lateral, front, back, top, bottom, above, below, vertical, horizontal, clockwise, counterclockwise, upstream, downstream, forward, aft, etc.) are used only for identification purposes to aid the reader's understanding of the present disclosure, and should not be construed as limiting on an example, particularly as to the position, orientation, or use of aspects of the disclosure described herein. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to one another. The exemplary drawings are for purposes of illustration only and the dimensions, positions, order and relative sizes reflected in the drawings attached hereto can vary.

FIG. 1 is a schematic cross-sectional diagram of a turbine engine 10 for an aircraft. The turbine engine 10 has a centerline or longitudinal axis 12 extending forward 14 to aft 16. The turbine engine 10 includes, in downstream serial flow relationship, a fan section 18 including a fan 20, a compressor section 22 including a booster or low pressure (LP) compressor 24 and a high pressure (HP) compressor 26, a combustion section 28 including a combustor 30, a turbine section 32 including a HP turbine 34, and a LP turbine 36, and an exhaust section 38.

The fan section 18 includes a fan casing 40 surrounding the fan 20. The fan 20 includes a plurality of fan blades 42 disposed radially about the longitudinal axis 12. The HP compressor 26, the combustor 30, and the HP turbine 34 form an engine core 44, which generates combustion gases. The engine core 44 is surrounded by core casing 46, which can be coupled with the fan casing 40.

A HP shaft or spool 48 disposed coaxially about the longitudinal axis 12 of the turbine engine 10 drivingly connects the HP turbine 34 to the HP compressor 26. A LP shaft or spool 50, which is disposed coaxially about the longitudinal axis 12 of the turbine engine 10 within the larger diameter annular HP spool 48, drivingly connects the LP turbine 36 to the LP compressor 24 and fan 20. The spools 48, 50 are rotatable about the engine centerline and couple to a plurality of rotatable elements, which can collectively define an inner rotor/stator 51. While illustrated as a rotor, it is contemplated that the inner rotor/stator 51 can be a stator.

The LP compressor 24 and the HP compressor 26 respectively include a plurality of compressor stages 52, 54, in which a set of compressor blades 56, 58 rotate relative to a corresponding set of static compressor vanes 60, 62 (also called a nozzle) to compress or pressurize the stream of fluid passing through the stage. In a single compressor stage 52, 54, multiple compressor blades 56, 58 can be provided in a ring and can extend radially outwardly relative to the longitudinal axis 12, from a blade platform to a blade tip, while the corresponding static compressor vanes 60, 62 are positioned upstream of and adjacent to the rotating compressor blades 56, 58. It is noted that the number of blades, vanes, and compressor stages shown in FIG. 1 were selected for illustrative purposes only, and that other numbers are possible.

The compressor blades 56, 58 for a stage of the compressor can be mounted to a disk 61, which is mounted to the corresponding one of the HP and LP spools 48, 50, with each stage having its own disk 61. The vanes 60, 62 for a stage of the compressor can be mounted to the core casing 46 in a circumferential arrangement.

The HP turbine 34 and the LP turbine 36 respectively include a plurality of turbine stages 64, 66, in which a set of turbine blades 68, 70 are rotated relative to a corresponding set of static turbine vanes 72, 74 (also called a nozzle) to extract energy from the stream of fluid passing through the stage. In a single turbine stage 64, 66, multiple turbine blades 68, 70 can be provided in a ring and can extend radially outwardly relative to the longitudinal axis 12, from a blade platform to a blade tip, while the corresponding static turbine vanes 72, 74 are positioned upstream of and adjacent to the rotating blades 68, 70. It is noted that the number of blades, vanes, and turbine stages shown in FIG. 1 were selected for illustrative purposes only, and that other numbers are possible.

The blades 68, 70 for a stage of the turbine can be mounted to a disk 71, which is mounted to the corresponding one of the HP and LP spools 48, 50, with each stage having a dedicated disk 71. The vanes 72, 74 for a stage of the compressor can be mounted to the core casing 46 in a circumferential arrangement.

Complementary to the rotor portion, the stationary portions of the turbine engine 10, such as the static vanes 60, 62, 72, 74 among the compressor and turbine section 22, 32 are also referred to individually or collectively as an outer rotor/stator 63. As illustrated, the outer rotor/stator 63 can refer to the combination of non-rotating elements throughout the turbine engine 10. Alternatively, the outer rotor/stator 63 that circumscribes at least a portion of the inner rotor/stator 51, can be designed to rotate. The inner or outer rotor/stator 51, 63 can include at least one component that can be, by way of non-limiting example, a shroud, vane, nozzle, nozzle body, combustor, hanger, or blade, where the at least one component is a plurality of circumferentially arranged component segments having confronting pairs of circumferential ends.

In operation, the airflow exiting the fan section 18 is split such that a portion of the airflow is channeled into the LP compressor 24, which then supplies pressurized airflow 76 to the HP compressor 26, which further pressurizes the air. The pressurized airflow 76 from the HP compressor 26 is mixed with fuel in the combustor 30 and ignited, thereby generating combustion gases. Some work is extracted from these gases by the HP turbine 34, which drives the HP compressor 26. The combustion gases are discharged into the LP turbine 36, which extracts additional work to drive the LP compressor 24, and the exhaust gas is ultimately discharged from the turbine engine 10 via the exhaust section 38. The driving of the LP turbine 36 drives the LP spool 50 to rotate the fan 20 and the LP compressor 24.

A portion of the pressurized airflow 76 can be drawn from the compressor section 22 as bleed air 77. The bleed air 77 can be drawn from the pressurized airflow 76 and provided to engine components requiring cooling. The temperature of pressurized airflow 76 entering the combustor 30 is significantly increased. As such, cooling provided by the bleed air 77 is necessary for operating of such engine components in the heightened temperature environments.

A remaining portion of the airflow 78 bypasses the LP compressor 24 and the engine core 44 and exits the turbine engine 10 assembly through a stationary vane row, and more particularly an outlet guide vane assembly 80, comprising a plurality of airfoil guide vanes 82, at the fan exhaust side 84. More specifically, a circumferential row of radially extending airfoil guide vanes 82 are utilized adjacent the fan section 18 to exert some directional control of the airflow 78.

Some of the air supplied by the fan 20 can bypass the engine core 44 and be used for cooling of portions, especially hot portions, of the turbine engine 10, and/or used to cool or power other aspects of the aircraft. In the context of a turbine engine, the hot portions of the engine are normally downstream of the combustor 30, especially the turbine section 32, with the HP turbine 34 being the hottest portion as it is directly downstream of the combustion section 28.

Other sources of cooling fluid can be, but are not limited to, fluid discharged from the LP compressor 24 or the HP compressor 26.

Figure 2:
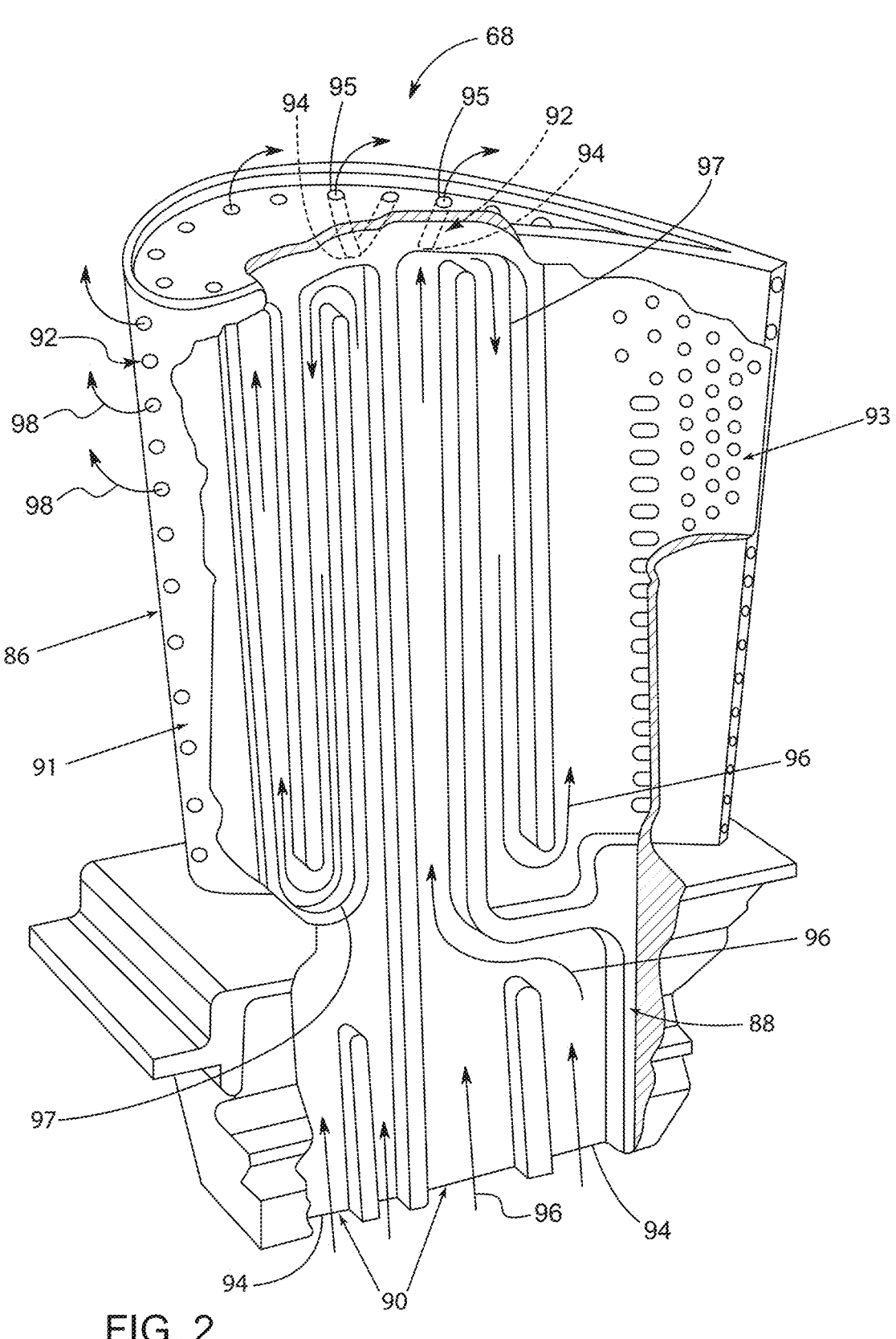
FIG. 2 is a schematic partial cutaway view of a blade of the turbine engine of FIG. 1.

FIG. 2 is a perspective view of a component for a turbine engine where the component is in the form of the blade 68 of the turbine engine 10 from FIG. 1. Alternatively, the component for turbine engine can include a HP compressor blade, a vane, a strut, a service tube, a shroud, or a combustion liner in non-limiting examples, or any other engine component that can require or utilize cooling passages.

The blade 68 includes a first surface spaced from a second surface. The first surface is illustrated as an exterior surface 86 that binds an interior 88. The interior 88 can be defined by the second surface. At least a portion of the interior can include at least one internal cooling circuit 90. A plurality of film holes or cooling holes 92 with inlets 94 fluidly couple the at least one internal cooling circuit 90 and outlets 95 formed in the exterior surface 86 of the blade 68. Fluid 96 flowing through the at least one internal cooling circuit 90 can pass through interior baffles 97 of the blade 68 and exit through the cooling holes 92 as exiting fluid 98. The fluid 96 can be any gas (such oxygen, carbon dioxide, nitrogen, or some combination therein) that is at room temperature or an elevated temperature. For example, the fluid 96 can be air that is at or warmer than an ambient temperature outside of the blade 68. The fluid 96 can be above ambient temperature during inspection of the cooling holes 92, but can be less than the temperature to which the blade 68 is exposed during operation of the turbine engine 10 that includes the blade 68. Alternatively, the fluid 96 can be at or below the ambient temperature. The fluid 96 optionally can be a liquid, such as water.

The blade 68 can have at least one portion, illustrated, by way of non-limiting example as a first portion 91 and a second portion 93. While the first portion 91 and the second portion 93 can be similar, it is contemplated that the first portion 91 and the second portion 93 can be made of different materials or combinations of materials, have different thermal properties, include different structural elements, include different subsets of cooling holes 92, include overlapping subsets of cooling holes 92, or have different thickness or types of coatings. The first portion 91 and the second portion 93 can be distinct or overlapping regions or portions of the blade 68. Further, the material or materials that make up the first portion 91 and the second portion 93 can be uniform throughout the respective first portion 91 or second portion 93. However, it is contemplated that the material or materials that make up the first portion 91 and the second portion 93 are not uniform throughout the respective portion or region.

Figure 3:
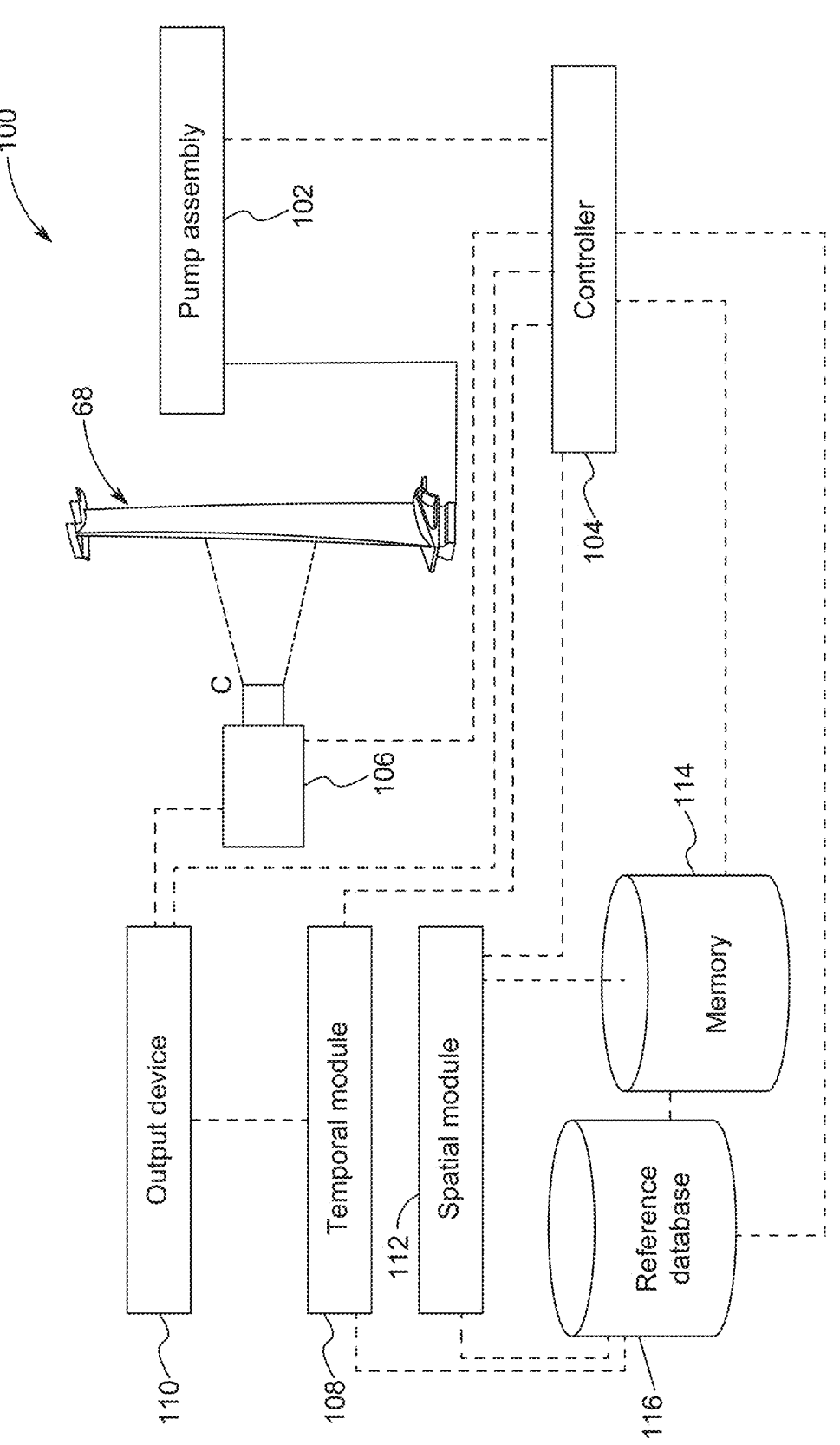
FIG. 3 illustrates a hole inspection system for the blade of FIG. 2.

FIG. 3 illustrates one example of a hole inspection system 100. The inspection system 100 can be used to image a turbine engine component of the turbine engine 10 or at least one portion of the turbine engine component. The turbine engine component is illustrated herein, by way of non-limiting example as a blade 68. The image completed by the inspection system 100 can be used to determine at least one fluid frequency that corresponds to the at least one portion of the turbine engine component or the blade 68.

Further, the inspection system 100 can be used to obtain airflow values related to each of the film holes or the cooling holes 92 or subsets of the cooling holes 92 included in the turbine engine component or the blade 68. The inspection system 100 can provide a dataset that is the combination of the airflow values for each of the cooling holes 92 or for the subset of the cooling holes 92 for the component or the blade 68.

The inspection system processes thermographic data of the cooling holes 92 and can spatially process the thermographic data of the cooling holes 92 to determine the airflow values for each of the cooling holes 92 or the subset of the cooling holes 92 in the blade 68. The airflow values for each of the cooling holes 92 is therefore based on outputs from the temporal and spatial processing of the thermographic data. The inspection system 100 independently processes the time domain of the thermographic data associated with each pixel (or other unit of data or display) in a video sequence of the thermographic data. This processing can collapse or otherwise reduce the thermographic data cube (of the changing pixel data over time) into a single normalized image having pixel values represent scores later used to determine the airflow values for each of the cooling holes 92 or the subset of the cooling holes 92.

The spatial processing of the thermographic data registers the thermographic data to find the location of the cooling holes 92, and calculates another score for the cooling hole 92 based on the spatial extent of the thermographic response of the cooling hole 92. The temporal and spatial scores are then combined to determine the airflow value for each of the cooling holes 92. The airflow value can be indicative of the airflow through the cooling holes 92 for each of the cooling holes 92 or the subset of the cooling holes 92. Additionally, or alternatively, the airflow value can be indicative of the effectiveness of the airflow to cool the surface of the inspected blade 68. The airflow value for each of the cooling holes 92 or the subset of the cooling holes 92 is then used to generate or determine the dataset related to or representative of the inspected blade 68.

The inspection system 100 can include a pump assembly 102 that is fluidly coupled to the blade 68, a controller 104, a thermographic sensor 106, and an output device 110. The controller 104 includes hardware circuitry that includes and/or is connected with one or more processors (e.g., one or more microprocessors, one or more field programmable gate arrays, and/or one or more integrated circuits) that control operations described in connection with the controller 104. The controller 104 can be any number of controllers in communication with at least one or more of the pump assembly 102, the thermographic sensor 106, or the output device 110. A temporal module 108 can be included with the controller 104 or any other controller in communication with controller 104 Similarly, a spatial module 112 can be included with the controller 104 or any other controller in communication with controller 104. Further, a memory 114 or a reference database 116 can be included with the controller 104 or any other controller in communication with controller 104. It is contemplated that the temporal module 108 or the spatial module 112 can be in communication with the memory 114 or the reference database 116. It is also contemplated that the temporal module 108 or the spatial module 112 can be in communication with the output device 110.

Figure 4:
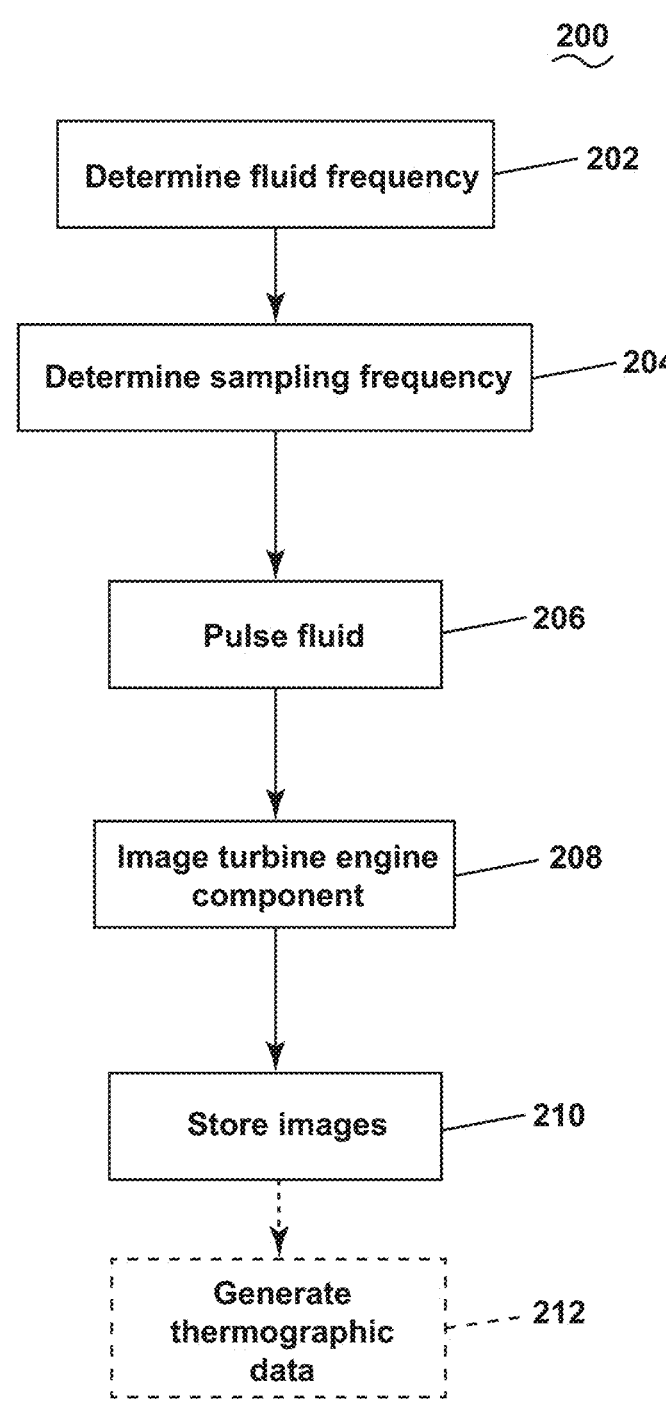
FIG. 4 illustrates a flowchart of a method for imaging a component of the turbine engine of FIG. 1.

With continued reference to the inspection system 100 shown in FIG. 3, FIG. 4 illustrates a flowchart of one aspect of a method 200 of imaging the turbine engine component or the blade 68. The blade 68 having the exterior surface 86 bounding the interior 88 with the at least one internal cooling circuit 90 and the plurality of holes 92 with inlets 94 fluidly coupled to the at least one internal cooling circuit 90 and outlets 95 formed in the exterior surface 86.

At 202, at least one fluid frequency is determined that corresponds to at least one portion of the blade 68. The at least one fluid frequency, or repetition rate, indicates how rapidly each pulse of the pulsing fluid is directed into the at least one internal cooling circuit 90. The at least one fluid frequency can be determined by calculating the at least one fluid frequency based on known properties of the portion of the blade 68. By way of non-limiting example, the at least one fluid frequency can be calculates as shown in Equation 1 below:

$$f = \frac{\alpha}{t^2} \tag{1}$$

where f represents the at least one fluid frequency of the portion of the blade 68, a is the thermal diffusivity of the portion of the blade 68, and t is the thickness of the portion of the blade 68. It is contemplated that additional aspects, properties, or material composition or compositions of the portion of the blade 68 can be included in Equation 1.

The portion of the blade 68 has one or more natural frequencies or resonant frequencies that, when a periodic force or a Fourier component of the periodic force is applied, the portion of the blade 68 will vibrate in such a way that it is heated due to resonance. The pulsing fluid 96 can supply the periodic force or the desired Fourier component of the periodic force when pulsed at the at least one fluid frequency calculated to be at or near the resonant frequency or a harmonic of the resonant frequency. The harmonic of the resonant frequency is a multiple of the resonant or fundamental frequency.

That is, the at least one fluid frequency of the fluid 96 pulsing can be selected at or close to the resonant frequency or the harmonic of the resonant frequency of the at least one portion of the blade 68. When the pulsing fluid 96 applies periodic force at or near one or more resonant frequencies of the at least one portion of the blade 68, the at least one portion of the blade 68 or one or more molecules or materials of the at least one portion of the blade 68 can vibrate in such a way that the at least one portion of the blade 68 is heated as a result of resonance.

Additionally, or alternatively to calculation, the at least one fluid frequency of the portion of the blade 68 can be determined by a computer model of the blade 68 or the portion of the turbine engine component or the blade 68. The computer model can determine the resonant frequency, a harmonic of the resonant frequency, or any other frequency that would produce the desired resonance or heating of the portion of the blade 68.

Further, the at least one fluid frequency of the portion of the blade 68 can be determined by an experimental method. That is, the determining at least one fluid frequency can be found through the collection and analysis of data. The blade 68 used in the experimental method can be, but is not limited to, a reference blade that is known to be within allowed tolerances.

The experimental method of determining at least one fluid frequency can include pulsing fluid 96 through the at least one internal cooling circuit 90 of the turbine engine component or the blade 68 at multiple fluid frequencies. The selection or determination of the multiple fluid frequencies can be input manually to the controller 104 or otherwise determined by one or more aspects of the controller 104 based on information, calculations, or modeling of the reference blade 68.

By way of non-limiting example, the controller 104 can estimate a resonant frequency or a harmonic of the estimated resonant frequency of the portion of the blade 68. The resonant frequency can be determined or estimated by knowing one or more materials that form the portion of the turbine engine component or the blade 68. The multiple fluid frequencies can be a range of frequencies that are within a predetermined percentage or harmonic of the estimated resonant frequency or the harmonic of the estimated resonant frequency. By way of non-limiting example, the estimated resonant frequency can be 300 Hertz. The predetermined range can be 20%, therefore, the multiple fluid frequencies are a range of frequencies between and including 240 Hertz and 360 Hertz. However, any predetermined range is contemplated. Pulsing the fluid 96 through the blade 68 at or near the resonant frequency for the portion of the blade 68, can heat the portion of the blade 68. As the pulsing fluid 96 exits the cooling holes 92, the pulsing fluid 96 can also cool the portion of the blade 68.

Alternatively, the controller 104 or the user can simply provide a range for the multiple fluid frequencies if a resonant frequency cannot be estimated.

A relative sampling frequency is determined for each of the multiple fluid frequencies in the range. The relative sampling frequency for each of the multiple fluid frequencies can be an image capture rate of the thermographic sensor 106. The thermographic sensor 106 can be, by way of non-limiting example, an infrared camera.

The relative sampling frequency is at least double the fluid frequency for each of the multiple fluid frequencies. That is, the controller 104 can relate each of the multiple fluid frequencies with one or more of the predetermined relative sampling frequencies. For example, if the fluid frequency is 100 Hertz, the relative sampling frequency can be 200 Hertz or more. It is further contemplated that more than one relative sampling frequency can be assigned to each of the multiple fluid frequencies. For example, if the fluid frequency is 100 Hertz, the relative sampling frequency can be 200 Hertz for a predetermined length time and 400 Hertz for another predetermined length of time. It is also contemplated that more than one thermographic sensor 106 can be imaging at different sampling frequencies. For example, while pulsing fluid 96 at 100 Hertz, a first thermographic sensor can have a sampling frequency of 200 Hertz and a second thermographic sensor can have a sampling frequency of 400 Hertz.

The controller 104 can communicate with the pump assembly 102 and the thermographic sensor 106 so that the thermographic sensor 106 images at the relative sampling frequency to the fluid frequency provided by the pump assembly 102. The imaging can be of the at least one portion of the blade 68 during the pulsing of each of the multiple fluid frequencies.

A pulse duration of each pulse of the pulsing fluid 96 can be determined or adjusted within each of the multiple fluid frequencies by the controller 104. The pulse duration can indicate how long fluid 96 is directed into the at least one internal cooling circuit 90 for each pulse of fluid 96. The pulse duration can be, by way of non-limiting example half of the inverse of each of the multiple fluid frequencies or less, as shown by the inequality of Equation 2 below:

$$d \le \frac{1}{2f} \qquad (2)$$

where d represents the pulse duration and f represents fluid frequency. It is contemplated that one or more pulse duration values can be communicated by the controller 104 to the pump assembly 102 while maintaining the same fluid frequency. It is contemplated that the pulse duration of each pulse of the pulsing fluid 96 can be less than or equal to 2 seconds. However, any length of pulse duration is contemplated.

The at least one fluid frequency can be determined for the at least one portion of the turbine engine component or the blade 68 based on the images for each the multiple fluid frequencies captured at the relative sampling frequency.

The images captured by the thermographic sensor 106 or the thermographic sensors are stored or evaluated at the controller 104. The temporal module 108 can be used to determine at which fluid frequency the images captured by the thermographic sensor 106 depict the desired image quality, contrast, or temperature contrast.

Additionally, or alternatively, the determining the at least one fluid frequency includes, at the controller 104, assigning a signal strength value to each of the images corresponding to the multiple fluid frequencies. A largest signal strength value can then determine the at least one fluid frequency for the at least one portion of the turbine engine component or the blade 68.

Optionally, the at least one fluid frequency can have one or more associated pulse durations values. That is, one or more pulse duration values can be assigned to or associated with the at least one fluid frequency.

When fluid 96 is pulsed at the at least one fluid frequency determined by calculation, computer simulation, or experimental method, the portion of the reference blade 68 is both heated and cooled by the pulsing fluid 96. The advantage of heating and cooling using the at least one fluid frequency is that no additional heating device is required in the inspection system 100 to heat the fluid or the component of the turbine engine or the blade 68. While additional heating devices are contemplated, the inspection system 100 is capable of thermal imaging using the pulsing fluid at the at least one fluid frequency. The at least one fluid frequency determined for the reference turbine engine component or the blade 68 can be used to image similar parts or portions of other parts as part of an inspection or other evaluation of the similar parts or portions.

The at least one fluid frequency of each pulse of the pulsing fluid 96 can be greater than or equal to 0.1 Hertz. It is further contemplated that the at least one fluid frequency can be between and including at least one of 10 Hertz-20 Hertz, 20 Hertz to 50 Hertz, or 50 Hertz to 100 Hertz. It is further contemplated that the at least one fluid frequency can be greater than or equal to 50 Hertz. That is, any non-zero frequency or range of frequencies is contemplated.

The at least one fluid frequency can include a first fluid frequency of the first portion 91 (FIG. 2) of the turbine engine component or the blade 68 and a second fluid frequency of the second portion 93 (FIG. 2) of the turbine engine component or the blade 68. The first fluid frequency and the second fluid frequency can be different. However, it is contemplated that the first fluid frequency and the second fluid frequency can be equal.

The first fluid frequency or the second fluid frequency can be a resonant frequency of the first portion 91 or the second portion 93 or a harmonic of the resonant frequency of the first portion 91 or the second portion 93, however any frequency is contemplated. The first fluid frequency or the second fluid frequency can be determined by calculation, computer simulation, or the experimental method as detailed above.

While illustrated as having the first portion 91 and the second portion 93, any number of portions are considered for which any number of fluid frequencies can be determined.

The pulsing fluid 96 can include fluid pulses greater than or equal to 15 pounds per square inch (approximately 103,421 Pa). The pulsing fluid 96 can be, but is not limited to, nitrogen, carbon dioxide, helium, argon, ambient air, or any combinations therein. The pulsing fluid 96 can be room temperature. Room temperature, as used herein, can be between 18-24° C. (approximately 64-75° F.). Additionally, or alternatively, the pulsing fluid can be heated or cooled to be equal to or between −220-2000° C. (approximately −364-3632° F.).

At 204, at least one sampling frequency is determined based on the at least one fluid frequency determined at 202. The at least one sampling frequency can be the image capture rate of the thermographic sensor 106. Further, the thermographic sensor 106 can be an infrared camera. The at least one sampling frequency is at least double the at least one fluid frequency.

It is contemplated that one or more sampling frequencies can be assigned to the at least one fluid frequency. For example, if the fluid frequency is 50 Hertz, the sampling frequency can be 100 Hertz for a predetermined length time and 200 Hertz for another predetermined length of time. It is also contemplated that more than one thermographic sensor 106 can be imaging at different sampling frequencies. For example, while pulsing fluid at 50 Hertz, a first thermographic sensor can have a sampling frequency of 100 Hertz and a second thermographic sensor can have a sampling frequency of 200 Hertz.

It is further contemplated that the at least one sampling frequency is equal to the relative sampling frequency if the at least one fluid frequency was determined using the experimental method.

The at least one sampling frequency can be a first sampling frequency and a second sampling frequency where the first sampling frequency is determined based on the first fluid frequency and the second sampling frequency is determined based on the second fluid frequency.

At 206, the pump assembly 102 can pulse fluid 96 at the at least one fluid frequency through the at least one internal cooling circuit 90 of the turbine engine component or the blade 68 to be imaged. The blade 68 to be imaged can be the reference blade, a test blade, or similar component.

It is contemplated that the rate, frequency, duration, or amount of the fluid 96 of each pulse can change between pulses, that is, the rate, frequency, duration, or amount of the fluid 96 does not need to be a repeating pattern or a consistent pattern.

Additionally, or alternatively, the pump assembly 102 can pulse fluid 96 at the first fluid frequency and the second fluid frequency. The pump assembly 102 can include any number of fluid sources, where each fluid source can have any number of fluid valves where the fluid valves selectively couple the one or more fluid sources to the at least one internal cooling circuit 90. Therefore, the pump assembly 102 can pulse fluid 96 at the second fluid frequency after pulsing fluid 96 at the first fluid frequency. Alternatively, the pump assembly 102 can pulse fluid at both the first fluid frequency and the second fluid frequency, where the pulses do not constructively or destructively combine. However, it is contemplated that the first fluid frequency and the second fluid frequency can be generated through the combination of pulses from more than one valve or fluid source.

The controller 104, can provide the pump assembly 102 with the at least one fluid frequency and the thermographic sensor 106 with the at least one sampling frequency so that, at 208 the at least one portion of the turbine engine component or blade 68 can be imaged using the thermographic sensor 106. The thermographic sensor 106 can capture images at the at least one sampling frequency while the pump assembly can pulse fluid 96 at the at least one fluid frequency.

The thermographic sensor 106 can capture images at the first sampling frequency when the fluid is pulsed at the first fluid frequency and capture images at the second sampling frequency when the fluid is pulsed at the second fluid frequency. However, it is contemplated that the thermographic sensor 106 can be multiple thermographic sensors that can image the blade 68 at least the first sampling frequency and the second sampling frequency concurrently, sequentially, or a combination therein.

At 210, the images or thermographic data obtained by the thermographic sensor 106 can be stored, for example, at the controller 104. The thermographic data can include a video, static images, or a combination thereof, that indicates temperatures with respect to the cooling holes 92 of the blade 68. The thermographic data can be saved in or on a tangible and non-transitory computer-readable storage medium, such as the memory 114. This memory 114 can represent one or more computer hard drives, optical discs, removable discs, or the like.

Optionally, at 212 thermographic data from the images of the turbine engine component or the blade 68 can be generated at the controller 104. The thermographic data can combine information from the images captured at the first fluid frequency and the second fluid frequency. The method 200 can further include calculating, at the controller 104, a performance score for the turbine engine component or the blade 68 based on the thermographic data. The details of obtaining thermographic data are further discussed in FIG. 5.

Figure 5:
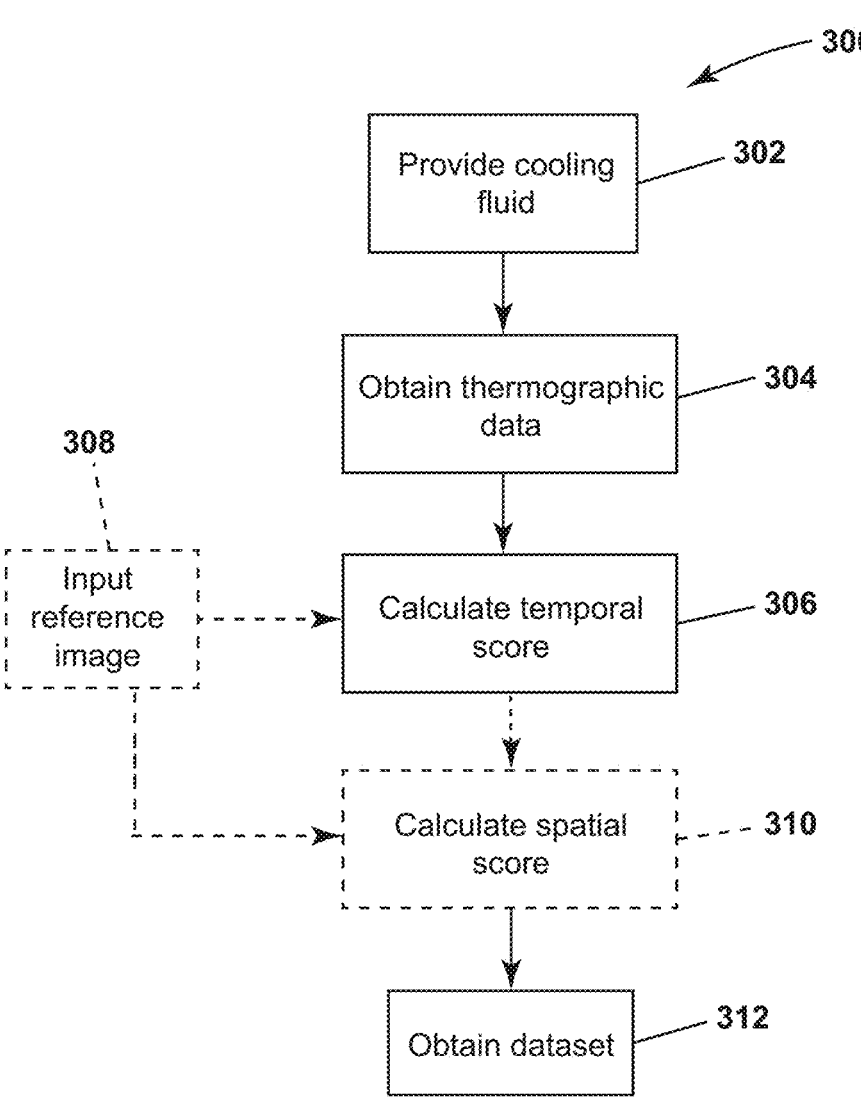
FIG. 5 illustrates a flowchart of a method for inspecting holes of the component of the turbine engine of FIG. 1.

With continued reference to the inspection system 100 shown in FIG. 3, FIG. 5 illustrates a flowchart of one aspect of a method 300. The method 300 can represent the operations performed by various parts of the inspection system 100 to generate or determine a dataset for the blade 68. The operations described in connection with the method 300 can be performed in an order or sequence that differs from the illustrated and/or described sequence. For example, the temporal processing by the temporal module 108 can be performed before, after, simultaneous with, or concurrently with, the spatial processing by the spatial module 112 described herein.

The operations described in connection with the method 300 can be performed for each of several pixels (or other areas or volumes) of the thermographic data that is output from the thermographic sensor 106. For example, the calculations and scores that are determined in connection with the method 300 can be separately and independently performed for each pixel in the thermographic data output by the thermographic sensor 106, regardless of whether some pixels or areas do not represent temperatures of the cooling hole 92. Alternatively, the calculations and scores that are determined in connection with the method 300 can be separately and independently performed for each of the pixels in the thermographic data output by the thermographic sensor 106 that represent the cooling hole 92, and not performed for pixels that do not represent the cooling hole 92.

At 302, fluid 96 is provided to the blade 68. The fluid 96 can be pumped or otherwise forced into the at least one internal cooling circuit 90 of the blade 68 by a pump assembly 102 of the inspection system 100. The pump assembly 102 can include one or more pumps that are fluidly coupled with the at least one internal cooling circuit 90 by one or more conduits. The pump assembly 102 also can be coupled with a source of the fluid 96, such as an inlet and optional filters that collect ambient air for pumping into the at least one internal cooling circuit 90 as the fluid 96. Alternatively, the pump assembly 102 can be coupled with a tank or container of the fluid 96. The fluid 96 is forced into the at least one internal cooling circuit 90 by the pump assembly 102 and out of the open cooling holes 92 and/or partially out of the partially blocked cooling holes 92. It is contemplated that at 302, the fluid is provided to the blade 68 at the at least one fluid frequency as determined by the method 200. Benefits of providing the pulsing fluid 96 at the at least one fluid frequency is that no heating elements are required to heat the blade 68 or the pulsing fluid 96. It is contemplated that the output device 110 can provide a user with the fluid temperature, the fluid pressure, the at least one fluid frequency, the pulse durations, and the fluid type. It is further contemplated that the user can adjust, provide input, or otherwise change the fluid temperature, pressure, fluid frequencies, pulse durations, and fluid type via the output device 110.

At 304, thermographic data related to the blade 68 is obtained. It is contemplated that the method 200 is used to obtain the images stored on the controller 104 at 210.

In one example, an infrared (IR) camera is used as the thermographic sensor 106, and the camera captures a video sequence of the blade 68 as the cooling fluid is pulsed toward the cooling holes 92. The captured video can include the surface of the blade 68 adjacent to the cooling holes 92 or a selected subset of the cooling holes 92. This video sequence can be obtained at one or more different frame rates, such as frame rates between five frames per second and 30,000 frames per second, or the like. This thermographic data can represent temperature fluctuations of the areas in and/or around the cooling holes 92. The thermographic data can be a video sequence of these temperature fluctuations for several pulses of the fluid 96 or a preset length of time. Optionally, the video sequence can be referred to as a data cube, and can be provided to one or more temporal modules 108 of the inspection system 100.

It is contemplated that the output device 110 can provide a user with the frames per second, sampling frequency, or length of time in which the thermographic sensor 106 collects data. It is further contemplated that the user can adjust the frames per second, sampling frequency, or length of time in which the thermographic sensor 106 collects data via the output device 110.

The temporal module 108 represents hardware circuitry that includes and/or is connected with one or more processors (e.g., one or more microprocessors, one or more field programmable gate arrays, and/or one or more integrated circuits) that perform the temporal processing of the thermographic data, as described herein. In one example, the hardware circuitry and/or one or more of the processors of the controller 104 and the temporal module 108 is the same hardware circuitry and/or the same processor. Alternatively, the controller 104 and temporal module 108 can be separate circuits and/or processors.

Figure 6:
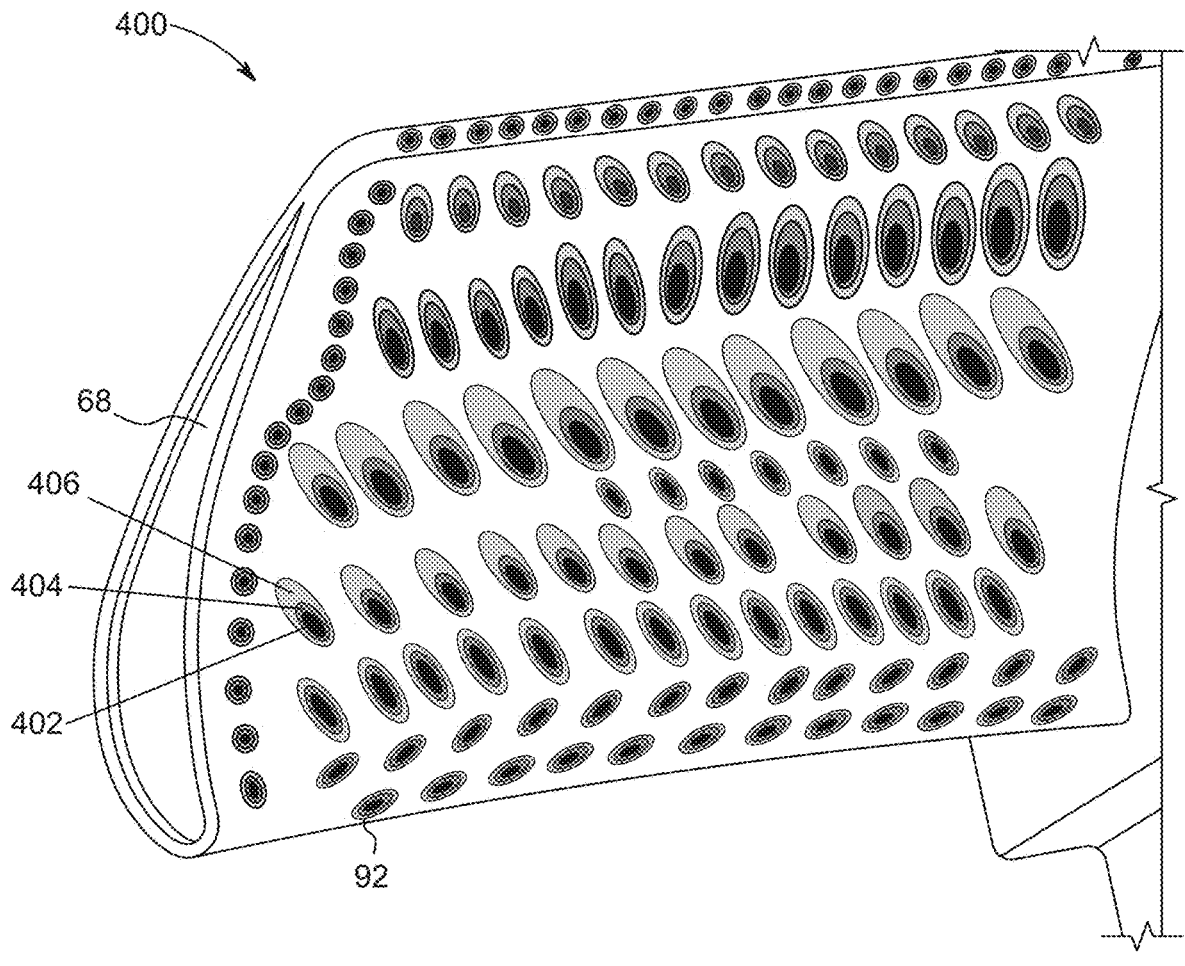
FIG. 6 illustrates an example frame of thermographic data obtained from a thermographic sensor of the hole inspection system of FIG. 3.

FIG. 6 illustrates one example frame 400 of the thermographic data obtained from the thermographic sensor 106. The controller 104 can direct the thermographic sensor 106 to obtain video sequences at different orientations to the blade 68. This can allow for the thermographic data to be obtained for each or all of the cooling holes 92 from a variety of different angles. Although not shown in FIG. 6, the controller 104 can generate and communicate control signals to motors, solenoids, or the like, that move the thermographic sensor 106 and/or the blade 68 to obtain the thermographic data from the multiple different orientations.

The example frame 400 illustrates regions of the blade 68 that are within one or more predetermined temperature ranges. While any number of ranges are contemplated, the blade 68 is illustrated as a first range 402, a second range 404, and a third range 406, indicating three different predetermined temperature ranges.

Returning to the description of the flowchart of the method 300 shown in FIG. 5, at 306, a temporal score can be calculated by temporal processing of the thermographic video data. The temporal processing can be performed by the temporal module 108 and/or the controller 104.

The temporal module 108 can calculate the temporal score for each pixel associated with each of the cooling holes 92. The temporal score can be calculated using thermographic video data for each pixel processed using statistical analysis, fast Fourier transform (FFT), Principle Component Analysis (CPA), Thermographic Signal Reconstruction (TSR), wavelet transformation, or any combination therein. The temporal scores for each pixel can be stored in the memory 114.

Additionally, or alternatively, the temporal module 108 can analyze, filter, or otherwise process the thermographic video data before determining the temporal score. For example, the temporal module 108 can include one or more of a high-pass filter, a low-pass filter, or other filtering electronics based on a signal-to-noise ratio, that can optionally be applied to the thermographic video data that is raw data, detrended data, filtered data, or normalized data.

It is further contemplated that the temporal score can be determined using the variation in the temperature field of the region of interest.

Optionally, at 308, a reference image of the blade 68 from the reference database 116 can be input or accessed by the temporal module 108. The reference image can provide general cooling hole locations or regions of interest to the temporal module 108. The temporal module 108 can then restrict the calculation of temporal scores to pixels located a predetermined distance or located at the cooling holes 92. That is, the reference image can provide regions of interest to the temporal module 108. Additionally, or alternatively, the temporal module 108 can use temperature gradient or differentiation to generally locate the cooling holes 92.

The method 300 can optionally include, at 310, calculating the spatial score. The spatial module 112 can process the thermographic data that is output by the thermographic sensor 106. This spatial processing can be performed to determine one or more spatial scores for one or more of the cooling holes 92. The temporal score or the spatial score associated with the same cooling hole can be used to generate or determine a dataset (as described below) to determine a performance score for the component of the turbine engine 10.

The calculation of the spatial score at 310 can begin with selecting a frame from the video output by the thermographic sensor 106. One or more spatial modules 112 of the inspection system 100 represent hardware circuitry that includes and/or is connected with one or more processors (e.g., one or more microprocessors, one or more field programmable gate arrays, and/or one or more integrated circuits) that perform the spatial processing of the thermographic data, as described herein. In one aspect, the hardware circuitry and/or one or more of the processors of the controller 104, the temporal module 108, and/or the spatial module 112 is the same hardware circuitry and/or the same processor. Alternatively, the controller 104, the temporal module 108, and/or the spatial module 112 can be separate circuits and/or modules or processors.

The spatial module 112 can select the frame from the thermographic data output from the thermographic sensor 106. For example, the spatial module 112 can select the same frame that corresponds with the normalized image determined by the temporal module 108. Optionally, the spatial module 112 can select another image frame.

Further, the reference image from the reference database 116 can be obtained. The reference image can be selected by the spatial module 112 from among several different reference images available in the memory 114 or the reference database 116. The different reference images can represent the locations of the cooling holes 92 in the blade 68 at different orientations and/or locations. The orientation and/or location at which the thermographic data is obtained by the thermographic sensor 106 can be provided to the spatial module 112 (e.g., by the thermographic sensor 106 and/or operator input), and the spatial module 112 can examine the reference images to determine which reference image has the same or most similar orientation and/or location. For example, metadata or other data associated with the different reference images can indicate the locations on the blade 68 depicted in the reference images and/or the orientations at which the reference images were obtained. The spatial module 112 can examine this metadata or other data to determine which reference image depicts the same or similar location and/or orientation of the blade 68. A reference image with the similar location and/or orientation can be the reference image depicting a location and/or orientation that is closer to the location and/or orientation imaged by the thermographic sensor 106 than one or more (or all) other reference images.

The reference image optionally can include or be stored with location data indicating where the cooling holes 92 are located within the reference image. This location data can be stored with the reference image in the memory 114 or the reference database 116. For example, the reference images can be stored with coordinates, pixel locations, or the like, that indicate where the cooling holes 92 are shown in the reference images.

Next, the spatial module 112 determines a registration transformation of the selected thermographic frame. The spatial module 112 can determine how the selected thermographic frame and/or the registration image need to be rotated and/or linearly moved so that the thermographic frame selected and the reference image obtained are aligned. The spatial module 112 can determine a transformation of the frame and/or image as a rotation and/or linear movement of the frame and/or image to align the frame and image for best matching of the cooling holes 92 in the frame and image. The transformation can be a three by three matrix having a two by two rotation matrix and two additional numbers specifying linear movements in orthogonal directions (e.g., along perpendicular x- and y-directions).

The spatial module 112 can apply the transformation to the frame and/or to the image to produce a processed, registered image having a known or designated alignment. The spatial module 112 can then determine where the cooling holes 92 are located (or should be located) in the thermographic video frame based on the known locations of the cooling holes 92 in the reference image. Because the frame and image have the same alignment, the spatial module 112 can use the known locations of the cooling holes 92 in the reference image to determine where the cooling holes 92 are or should be located in the video frame.

It is contemplated that the calculation of the spatial score at 310 can further include a cooling hole refinement process. This refinement process can be performed by the spatial module 112 to determine the locations of at least some of the cooling holes 92 in the thermographic video frame. The relative locations of the cooling holes 92 can be known (e.g., stored in the memory 114 and/or the reference database 116), such as from the manufacturing specifications of the blade 68. For example, vectors defining the distance and angle from one of the cooling holes 92 to another (e.g., neighboring) cooling hole 92 can be stored in the memory 114 and/or the reference database 116.

The spatial module 112 can examine the thermographic video frame and compare intensities (or colors or other features) of the pixels in the frame to identify one or more of the cooling holes 92. For example, the cooling hole 92 can appear brighter or in a different color in the frame than other parts of the blade 68 that are not the cooling holes 92. The spatial module 112 can use the different appearance of the cooling holes 92 to automatically find at least one of the cooling holes 92. The spatial module 112 can then record the location of the found cooling hole 92 in the memory 114 and/or the reference database 116.

The spatial module 112 can then examine the frame in areas from the found cooling hole 92 where another of the cooling holes 92 should be located (based on the known relative locations of the cooling holes 92). For example, if the cooling holes 92 are designed to be a designated distance away from each other, the spatial module 112 can examine the frame in several potential locations that are the designated distance away from the location of the found cooling hole 92. The spatial module 112 can examine these potential locations to determine whether the pixels at these potential locations indicate that the cooling hole 92 is at one or more of the potential locations (e.g., using the characteristics of the pixels, such as the intensities, colors, etc.). Once the additional cooling hole 92 is found, the spatial module 112 can repeat this sequential, iterative process to find the locations of additional cooling holes 92 in the frame.

In one example, the frame having the identified locations of the cooling holes 92 is output as a processed image. The spatial module 112 can send the frame with the identified cooling hole locations to the memory 114, the reference database 116, and/or to the output device 110 as the processed image. This can permit an operator of the inspection system 100 to view the processed image to verify or otherwise inspect the cooling holes 92 identified by the spatial module 112.

The process of calculating the spatial score at 310 further includes obtaining the hole locations and cooling hole shape information. The hole locations are referred to as "hole coordinates" and the cooling hole shape information is referred to as "ellipse information" in FIG. 5. The cooling hole locations can be determined as described above. The shape information is information indicating the shape of the cooling holes 92. Some of the cooling holes 92 can have an elliptical shape, while other cooling holes 92 can have other shapes (e.g., circles, polygons, etc.). The shapes of the cooling holes 92 can be stored in the memory 114 or the reference database 116 and can be retrieved from the memory 114 or the reference database 116 by the spatial module 112. The shape information of the cooling hole 92 assists the spatial module 112 in examining a designated set of pixels in the registered thermographic video frame that are associated with the cooling hole 92 to determine the spatial score for that cooling hole 92.

The shapes associated with the cooling holes 92 can be based on the identified locations of the cooling holes 92. For example, the cooling holes 92 in different areas of the blade 68 can have different shapes. The cooling holes 92 near one or more edges of the blade 68 can have one shape, while the cooling holes 92 farther from the edges of the blade 68 can have another, different shape. The spatial module 112 can examine the identified locations of the cooling holes 92 in the registered frame and determine the designated shapes of these cooling holes 92 based on the identified locations.

Areas (or regions) of interest around the cooling holes 92 are identified by the spatial module 112 based on the designated shapes associated with the cooling holes 92. While FIG. 5 refers to the areas of interest as "elliptical regions of interest," not all examples of the aspects of the disclosure are limited to elliptical regions of interest. As described above, the regions or shapes can have another non-elliptical shape, such as a circle, polygon, or the like. The region of interest for the cooling hole 92 includes the area around the identified location of the cooling holes 92 that is within the designated shape associated with the cooling hole 92. For example, the spatial module 112 can select those pixels that are within the elliptical shape of the cooling hole 92 (around the identified location of the cooling hole 92) in the registered frame as the region of interest for that cooling hole 92. The spatial module 112 can position the designated shape of the cooling hole 92 around the cooling hole 92 so that the cooling hole 92 is at a center of the designated shape or at another location. For example, the spatial module 112 can position a designated elliptical shape around the cooling hole 92 with the identified location of the cooling hole 92 at one of the focal points of the elliptical shape. As another example, the spatial module 112 can position a designated shape around the cooling hole 92 with the identified location of the cooling hole 92 at the center of the shape. Optionally, the spatial module 112 can position a designated shape around the cooling hole 92 with the identified location of the cooling hole 92 being on an outer edge of the designated shape.

The spatial module 112 also can orient the designated shapes with respect to the cooling holes 92. For example, different cooling holes can be oriented different direction based on where the cooling holes 92 are located in the blade 68. The cooling holes 92 in one area of the blade 68 can have elliptical shapes with the focal points of the elliptical shapes located along first lines, while the cooling holes 92 in another area of the blade 68 can have elliptical shapes with the focal points of the elliptical shapes located along different, second lines, where the first and second lines are at different angles with respect to each other and/or a center axis of the blade 68. The orientations of the designated shapes of the cooling holes 92 can be stored in the memory 114 or the reference database 116 and obtained by the spatial module 112.

Figure 7:
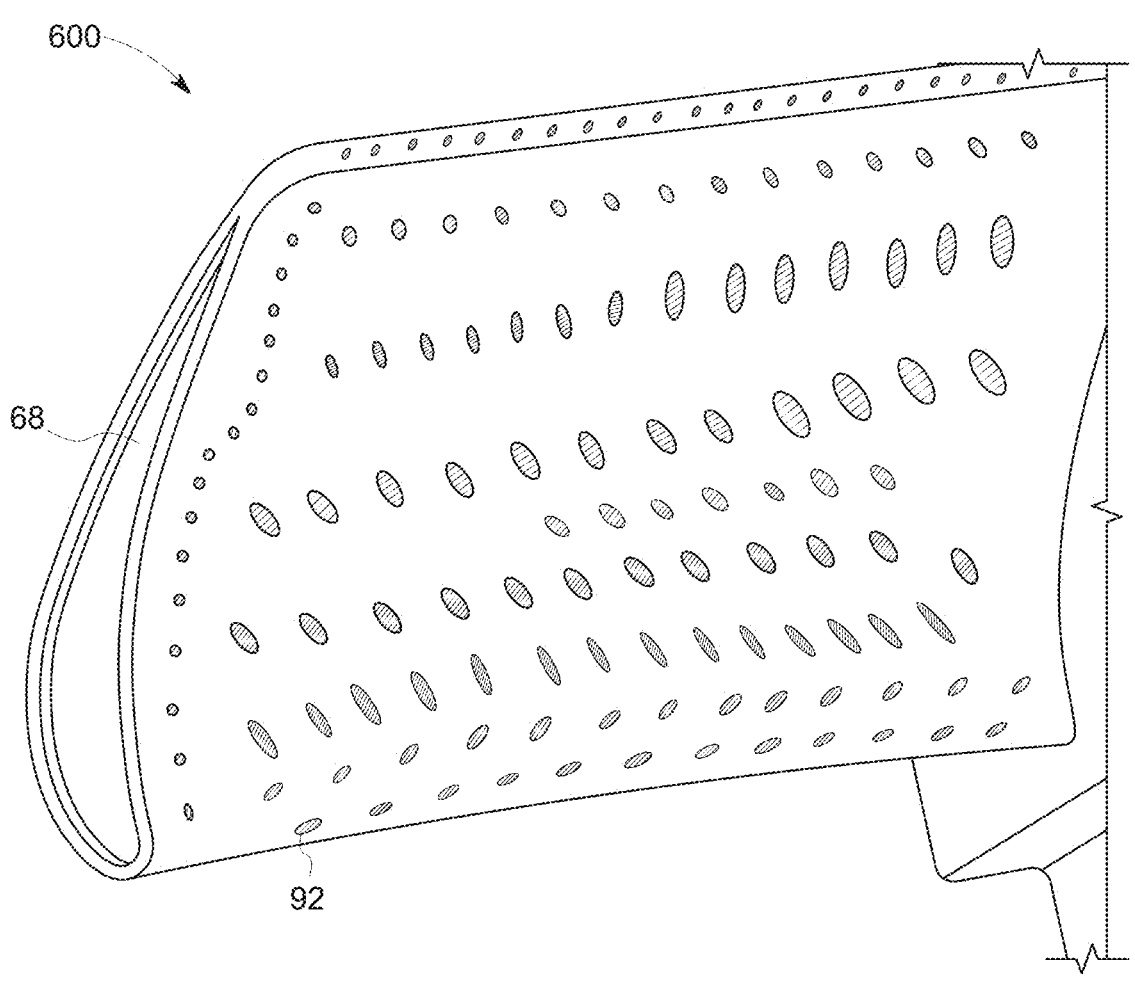
FIG. 7 shows a normalized image for a portion of the blade shown in FIG. 2.
Figure 8:
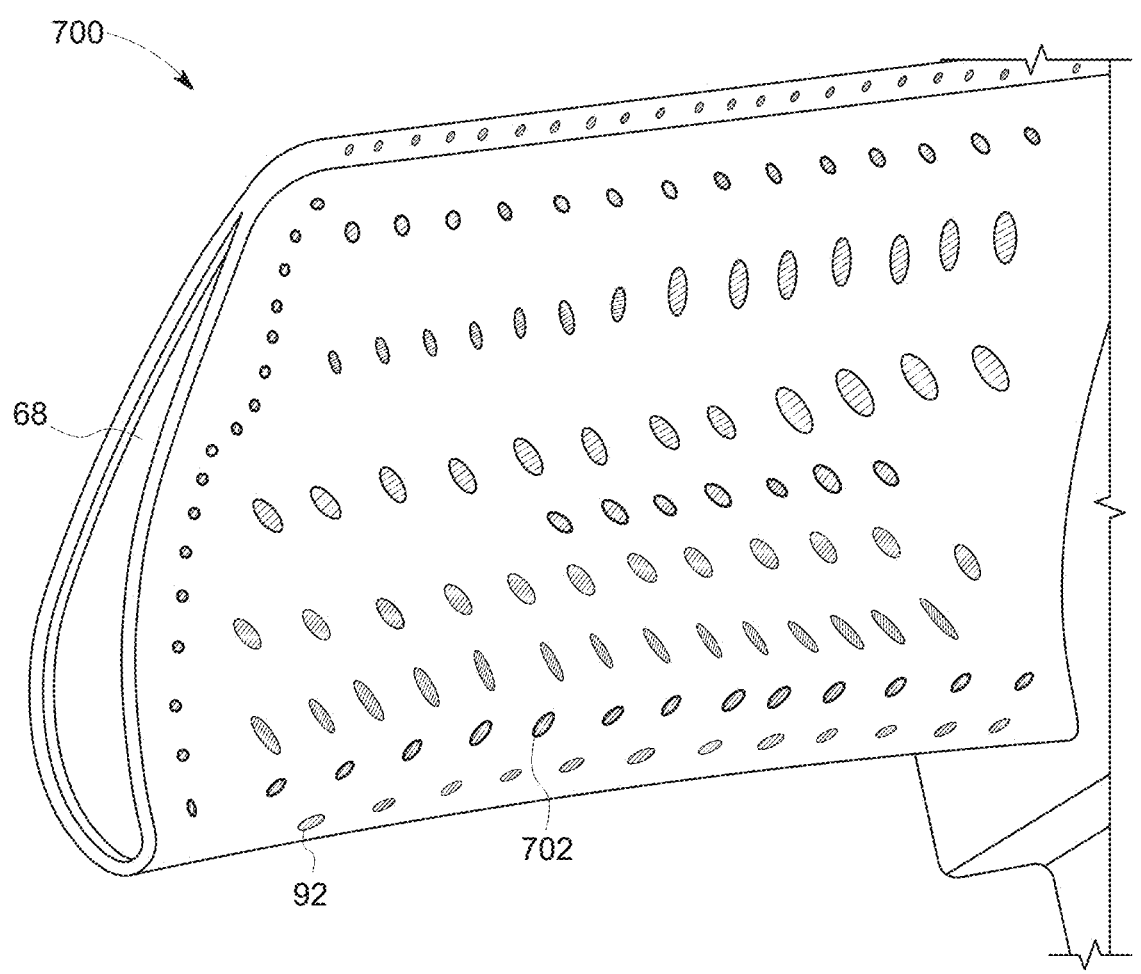
FIG. 8 illustrates a registered frame for a portion of the blade shown in FIG. 1.

FIG. 8 illustrates a registered frame 700 for a portion of the blade 68. The registered frame 700 can be the registered frame obtained from or based on the normalized image 600 shown in FIG. 7. The frame 700 shows a portion of the blade 68 and several of the cooling holes 92. Several identified regions of interest 702 around the cooling holes 92 also are shown in FIG. 8. The regions of interest 702 are the areas around the cooling holes 92 that are identified by the spatial module 112, as described above. The spatial module 112 can include the pixels in the frame 700 that are within the regions of interest 702 to be associated with the corresponding cooling hole 92. For example, the spatial module 112 can associate the pixels within the region of interest 702 of the cooling hole 92. As a result, the different cooling holes 92 in the frame 700 are associated with different groups of pixels. In one example, the cooling holes 92 are located and the designated shapes are sized and oriented such that no pixel in the frame 700 is included in regions of interest 702 associated with the different cooling holes 92.

Returning to the description of the flowchart of the method 300 shown in FIG. 5, at 310 where spatial scores are determined for the cooling holes 92. The spatial module 112 can calculate the spatial scores for the cooling holes 92 based on characteristics of the pixels associated with the different cooling holes 92. As one example, the spatial module 112 can calculate the spatial score for the cooling hole 92 as the fraction of pixels within the region of interest 702 of the cooling hole 92 that have a characteristic that exceeds a designated lower limit This characteristic can be an intensity, contrast, or the like, of the pixels. Alternatively, this characteristic can be the temporal score of the pixel, as described above. The lower limit can be a default system limit and/or a limit that can be modified by an operator of the inspection system 100.

At 312, the dataset can be obtained. Building the dataset can include determining a fluid flow value illustrated as an airflow value for each of the cooling holes 92 or the subsets of the cooling holes 92. The airflow value can be a set of calculated values or a combination of values from any point of the method 300. The spatial module 112 or the temporal module 108 can calculate an airflow value for each of two or more cooling holes 92 (but not necessarily all the cooling holes 92) based on the temporal score, the spatial score, or both the spatial and temporal scores. In one example, the airflow value for the cooling hole 92 is an average of the spatial score of the region of interest 702 of the cooling hole 92 and a median of a designated portion of the temporal scores for those pixels within the region of interest 702 of the cooling hole 92. That is, one or more the spatial scores, temporal scores, or a combination therein can provide at least one cooling effectiveness score related to a region surrounding one or more cooling holes 92. The airflow value can include the at least one cooling effectiveness score or be equal to the cooling effectiveness score. The at least one cooling effectiveness score can be any combination of data, scores, or values that provide information related to how the surrounding region or the region of interest 702 surrounding one or more cooling holes 92 changes temperature. By way of non-limiting example, the cooling effectiveness score can be determined from the temperature change of each of the pixels in the region of interest 702 surrounding one or more cooling holes 92 over a predetermined length of time or number of frames. It is contemplated that the cooling effectiveness score can be determined for each of the pixels in the region of interest 702.

It is further contemplated that the cooling effectiveness score can be determined in part using any known temperature sensing devices or methods or combination therein. Some non-limiting examples of temperature sensing devices or methods that can be used or included in methods to determine or provide values for the calculation of the cooling effectiveness score include, but are not limited to, IR cameras, thermocouples, resistance temperature detectors, pressure sensitive paint, species concentration methods, or sublimation methods. Additionally, or alternatively, at 312, the cooling effectiveness score can be calibrated using any known temperature sensing devices or methods or combination therein.

Optionally, the combination of the spatial score and the temporal scores for the cooling hole 92 can further be used to provide a qualitative identification of whether the cooling hole 92 is open, blocked, or partially blocked.

The airflow value can be a product of the temporal score and the spatial score, an addition of the temporal score and the spatial score with at least one of these scores being weighted differently than the other score, a division of the temporal score by the spatial score, a division of the spatial score by the temporal score, or the like. It is contemplated that any combination of the spatial score and the temporal scores can be used to generate or determine the airflow value. The airflow value can be determined or generated by the spatial module 112 and stored in the memory 114 and/or 116 or presented on the output device 110.

The airflow values determined for the cooling holes 92 or the subsets of cooling holes 92 for the entire blade 68 can be combined to form or build the dataset. The dataset can be representative of the blade 68. The dataset and information about the corresponding blade 68 can be can be stored in the memory 114 and/or 116 or presented on the output device 110.

The controller 104 can select an image or series of images from the thermographic data collected by the thermographic sensor 106. The controller 104 can be presented with one or more temporal scores, spatial scores, normalized images, airflow values, thermographic data, other data signals, an identification of one or more of the cooling holes 92 as a generated or determined dataset that can be provided by an output device 110 of the inspection system 100. The output device 110 can represent a display, speaker, or the like.

Figure 9:
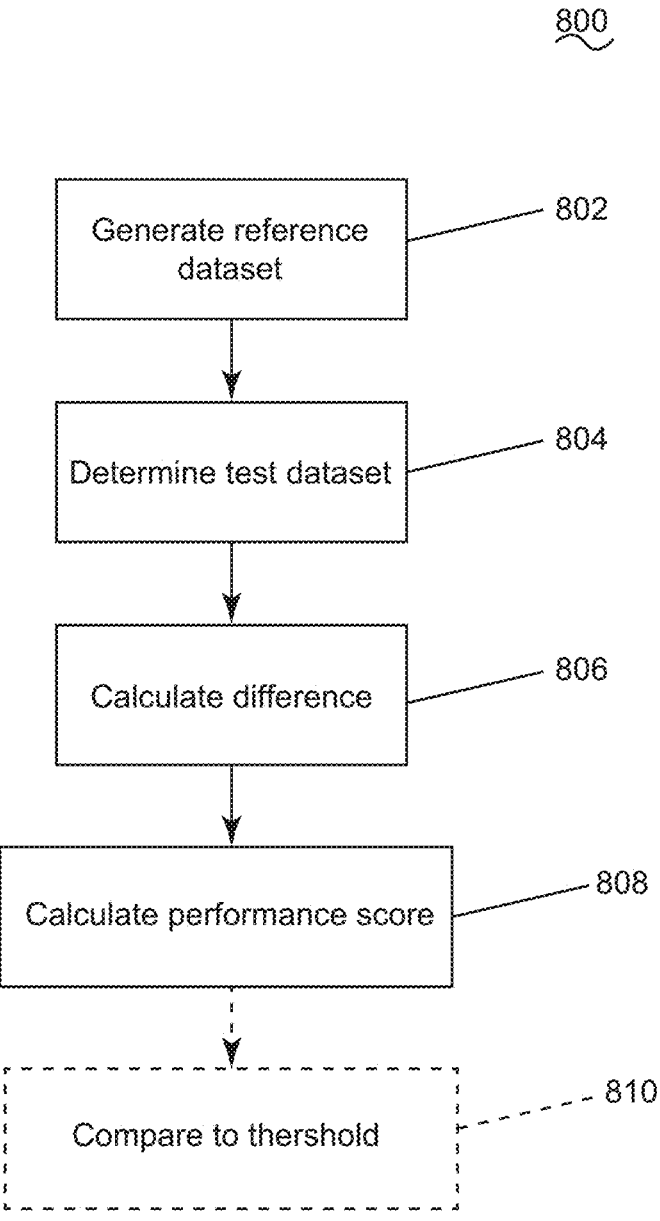
FIG. 9 illustrates a flowchart of a method of performance scoring fluid flow through the turbine engine of FIG. 1.

FIG. 9 illustrates a flowchart of one aspect of the method 800 of performance scoring airflow through a turbine engine component. By way of nonlimiting example, the turbine engine component can be the blade 68, although any component with film holes or cooling holes can be considered.

At 802, a reference dataset is generated. The reference dataset can be for at least one of the subsets of the cooling holes 92. One or more reference airflow values can be included in the reference dataset indicative of the airflow through one or more of the cooling holes 92 or the subset of the cooling holes 92. The reference airflow value can be a normalized value from an aggregate of measured airflow values for multiple turbine engine components. That is, more than one turbine engine component can provide datasets via the inspection method 300 previously discussed. The multiple datasets representative of the multiple engine components can be normalized or otherwise combined to generate the reference dataset. The reference dataset can provide reference airflow values to which other airflow values can be compared. The reference dataset can include a measure of the mean, the median, the upper limit, the lower limit, or any other suitable statistic such as, but not limited to, the standard deviation.

At 804, a test dataset can be determined for a test component. The test dataset can include test airflow values for each of the cooling holes in the subset of the cooling holes. A difference between the test dataset and the reference dataset is calculated at 806. The difference can be a mathematical comparison of each of the reference airflow values and corresponding test airflow values. At 806, the calculated difference can then be used to calculate a performance score for the turbine engine component.

In operation, by way of non-limiting example, the reference dataset can be generated at 802 using the inspection system 100 with the method 300 on a plurality of selected reference components or, in this non-limiting example, blades, which can be used for the blades 68. The plurality of selected reference blades can all be the same make or model and manufactured within allowed tolerances. By way of non-limiting example, the plurality of selected reference blades can be a set of at least five blades or more. Each of the plurality of selected reference blades generates a dataset corresponding to the cooling hole or holes of that specific blade. The multiple datasets that correspond the plurality of selected reference blades can be stored or received by the controller 104, the memory 114 and/or 116, or other data storage or processing devices.

The controller 104 or appropriate computational device can then combine values across the datasets for each of the corresponding cooling holes 92 of the reference blades, generating the reference dataset. The reference dataset can be a normalization or other mathematical combination of corresponding airflow values for the corresponding cooling holes 92 across the datasets provided by the plurality of selected reference blades. That is, the combination of the airflow values from each of the datasets obtained from the reference blades can generate reference airflow values for each cooling hole 92 or the subset of the cooling holes 92.

At 804, the test dataset can be generated using the inspection system 100 with the method 300 on the test blade. The test dataset can be a list or combination of test airflow values for the one or more cooling holes of the test blade. At 806, a difference between the test dataset and the reference dataset is calculated by the controller 104 or appropriate computational device. The difference can be any mathematical calculation that illustrates any discrepancies between the reference airflow values and the test airflow values of each of the test blade cooling holes. The difference can be calculated for all of the cooling holes 92 on the test blade or at least a subset of cooling holes. At 808, the calculated differences are then combined to calculate the performance score for the test blade. The test dataset or one or more of the test airflow values can be used to updated the reference dataset or further normalize the reference airflow value.

Optionally, at 810, the performance score of the test blade can be compared to a predetermined threshold performance score or predetermined range of performance values. The predetermined threshold performance score or the predetermined range of performance values can be determined from design calculations, historic accumulated data, a reference database, or a reference part, where the reference part is known to be within accepted tolerances or tested using one or more additional inspection methods.

The comparison of the performance score to the threshold performance score or predetermined range of performance values can result in at least one responsive action. The at least one responsive action can include, but is not limited to: redesign the component, passing the component, or failing the component. If the performance score, for example, is greater than or less than the threshold performance score or range of accepted performance values, the at least one responsive action can include, but is not limited to failing the test blade, where repair, replacement, or change in scheduled maintenance of the test blade can result from the failing of the test blade. If the performance score, for example, is within tolerance or a predetermined range of performance values deemed acceptable, the test blade can be passed. The passing of the test blade can result in the test blade being installed or reinstalled in the turbine engine 10.

It is also contemplated that the comparison of the performance score to the predetermined range of performance values can be used, at least in part, to influence the design or manufacturing process of the turbine engine component or the blade. For example, the comparison of the performance score to the predetermined performance ranges can indicate overperformance, acceptable performance, or underperformance of the blade 68. If the performance score of the blade 68 indicates overperformance, more bleed air than necessary was exhausted through outlets 95 of the blade 68. This can be indicative of, for example, the cooling holes 92 that are larger than required. Additionally, or alternatively, overperformance can occur based on cooling hole shape, location, or cooling flow supply pressure.

Underperformance of the blade 68 can indicate that there isn't enough bleed air exiting the blade 68 via the outlets 95 in the desired locations. This can be indicative of blocked or partially blocked cooling holes 92.

When the blade 68 has a performance score that categorizes the blade 68 as overperforming or underperforming, the responsive action can be to redesign the blade 68.

Alternatively, the blade 68 can be passed. In the context of manufacturing and design, when the performance score falls in the range of performance scores deemed acceptable, this can indicate an effective redesign in the blade or that a change in design the blade design had little or no effect on performance, given the original design also fell within the acceptable range.

The redesign of the blade can include changes in the design or manufacturing process of the blade or any other turbine engine component. The redesign of the blade or turbine engine component can be assessed using performance scores. The performance score can be used to detect improvements in design or manufacturing changes. Further, one or more materials from which the blade is made can be changed as part of the redesign of the blade.

Technical effect of the method and system disclosed herein provides a performance score for a component of turbine engine indicative of the airflow through film holes or subset of a plurality of film holes. Another technical effect of the imaging system is to determine at least one fluid flow frequency, so that when fluid is pulsed at the at least one fluid flow frequency, the temperature of the component of the turbine engine is changed using resonant properties of the one or more materials of one or more portions of the turbine engine component. The turbine engine component can be heated or cooled by the pulsing fluid at the at least one fluid flow frequency based on the flow pressure. The inspection system can be used to pulse fluid through the turbine engine component at the at least one fluid frequency at a pulse duration while the thermographic sensor obtains data used by the controller to establish a reference dataset and a test dataset, where the performance score is the difference between the reference dataset and the test dataset.

Benefits of the aspects described herein provide a performance score for a part indicative of overperformance, acceptable performance, or underperformance. The part can then be further accepted or rejected based on the performance score. Additionally, the design or redesign of the component can be assessed.

Additional benefits include the evaluation and the ability to store and monitor datasets from a variety of components for turbine engines. The performance scores can be used to accept or reject components or as part of testing a redesign of the component.

Further, the detection of overperformance can improve the waste of bleed air, increasing the overall efficiency of the engine.

Benefits of the method for imaging the turbine engine component include providing the pulsing fluid so that as the fluid pulses through the turbine engine component, one or more portions of the turbine engine component are heated by resonance of the pulsing fluid. As the pulsing fluid exits the cooling holes, the turbine engine component can be cooled. The thermal sensor can then capture images used as thermal data to determine the effectiveness of the cooling of each of the cooling holes. No additional heating of the fluid or turbine engine component is required.

While the inventive subject matter has been described with regard to the calculation of a performance score for a turbine engine blade, the inventive subject matter can be used to detect defects or rate performance of any type of component that includes holes or channels formed through the workpiece. The inventive subject matter is not limited to the specific aspects described and illustrated herein. Different aspects and adaptations besides those shown herein and described, as well as many variations, modifications and equivalent arrangements will now be apparent or will be reasonably suggested by the foregoing specification and drawings, without departing from the substance or scope of the inventive subject matter.

This written description uses examples to describe aspects of the disclosure described herein, including the best mode, and also to enable any person skilled in the art to practice aspects of the disclosure, including making and using any devices or systems and performing any incorporated methods. The patentable scope of aspects of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Further aspects of the disclosure are provided by the subject matter of the following clauses:

1. A method of performance scoring airflow through a turbine engine component having a first surface and a second surface spaced from the first surface, and a plurality of film holes with inlets formed in the second surface fluidly coupled to outlets formed in the first surface, the method comprising generating a reference dataset for at least a subset of the plurality of film holes, the reference dataset comprising a reference airflow value indicative of the airflow through the film holes for each of the film holes in the subset of the plurality of film holes, where the reference airflow value is a normalized value, determining a test dataset for a turbine engine component comprising test airflow values for at least some of the film holes in the subset of the plurality of film holes, calculating a difference between the test dataset and the reference dataset, and calculating a performance score for the turbine engine component based on the difference.

2. The method of clause 1 wherein the normalized value is determined from an aggregate of measured airflow values for multiple turbine engine components.

3. The method of any preceding clause further comprising updating the normalized value based on the corresponding test airflow values.

4. The method of any preceding clause wherein the subset of the plurality of film holes comprises all of the plurality of film holes.

5. The method of any preceding clause wherein the first surface is an exterior bounding an interior defined by the second surface, wherein the interior comprises multiple cooling air circuits and the plurality of film holes comprises different groups of film holes, with each grouping fluidly coupled to a different one of the cooling air circuits and the subset of film holes comprises at least some film holes from each grouping.

6. The method of any preceding clause further comprising comparing the performance score to a threshold performance score value.

7. The method of any preceding clause further comprising initiating a responsive action based on the comparison of the performance score to the threshold performance score value.

8. The method of any preceding clause wherein the responsive action comprises at least one of: passing the turbine engine component, failing the turbine engine component, or redesigning the turbine engine component.

9. The method of any preceding clause wherein the turbine engine component can be one of a blade, vane, strut, service tube, shroud, or a combustion liner.

10. The method of any preceding clause wherein the reference airflow value or the test airflow values includes at least one cooling effectiveness score.

11. The method preceding clause wherein further comprising calibrating the at least one cooling effectiveness score.

12. The method of any preceding clause wherein the redesign the blade, vane, strut, service tube, shroud, or a combustion liner includes a change in manufacturing process, material, or design.

13. The method of any preceding clause wherein the reference dataset is generated or the test dataset is determined by inspecting the plurality of film holes of a plurality of selected reference components with a hole inspection system.

14. The method of any preceding clause wherein the inspecting the plurality of film holes includes determining a spatial score or a temporal score.

15. The method of any preceding clause wherein the spatial score or the temporal score are used to generate the reference airflow value or determine the test airflow values.

16. The method of any preceding clause wherein the spatial score or the temporal score is determined using thermographic data.

17. The method of any preceding clause wherein the thermographic data is generated from thermographic images.

18. The method of any preceding clause wherein the thermographic images are generated by a thermographic camera.

19. The method of any preceding clause wherein the inspecting of the plurality of film holes further includes pulsing fluid through the turbine engine component with a pump assembly.

20. The method of any preceding clause wherein the pulsing fluid can include fluid pulses greater than or equal to 15 pounds per square inch (approximately 103,421 Pa).

21. The method of any preceding clause wherein the pulsing fluid is nitrogen, carbon dioxide, helium, argon, ambient air, or any combinations therein.

22. The method of any preceding clause wherein a spatial score or a temporal score are used to generate the reference airflow value or determine the test airflow values.

23. The method of any preceding clause wherein the multiple turbine engine components includes 5 or more components.

24. The method of any preceding clause wherein turbine engine component can be one of a blade, vane, strut, service tube, shroud, or a combustion liner.

25. The method of any preceding clause further comprising a thermographic sensor with sampling frequency of that is equal to or a multiple of the fluid frequency of each pulse of the pulsing fluid.

26. The method of any preceding clause wherein a pulse duration of each pulse of the pulsing fluid is less than or equal to 1 second.

27. A method of imaging a turbine engine component having a first surface and second surface spaced from the first surface, and a plurality of holes with inlets formed in the second surface fluidly coupled to outlets formed in the first surface, the method comprising determining at least one fluid frequency corresponding to at least one portion of the turbine engine component, determining, based on the at least one fluid frequency, at least one sampling frequency, pulsing fluid at the at least one fluid frequency through at least a portion of the plurality of holes of the turbine engine component, imaging, during the pulsing of the fluid, the at least one portion of the turbine engine component using a thermographic sensor that captures images at the at least one sampling frequency, and storing the images captured by the thermographic sensor.

28. The method of any preceding clause, wherein the determining the at least one fluid frequency further comprises pulsing fluid through the at least a portion of the plurality of holes of the turbine engine component at multiple fluid frequencies.

29. The method of any preceding clause, further comprising determining a relative sampling frequency for each of the multiple fluid frequencies.

30. The method of any preceding clause, further comprising imaging the at least one portion of the turbine engine component at each of the relative sampling frequencies using the thermographic sensor.

31. The method of any preceding clause, further comprising determining the at least one fluid frequency of the at least one portion of the turbine engine component based on the images for each the multiple fluid frequencies captured at the relative sampling frequency.

32. The method of any preceding clause, wherein the determining the at least one fluid frequency includes, at a controller, assigning a signal strength value to each of the images corresponding to the multiple fluid frequencies, wherein a largest signal strength value determines the at least one fluid frequency for the at least one portion of the turbine engine component.

33. The method of claim 1, wherein the determining the at least one fluid frequency further comprises calculating the at least one fluid frequency based on known properties of the at least one portion of the turbine engine component or a computer model of the at least one portion of the turbine engine component.

34. The method of any preceding clause, wherein the at least one fluid frequency is within 5% of a resonate frequency or a harmonic of the resonate frequency determined by one or more materials that form the at least one portion of the turbine engine component.

35. The method of any preceding clause, wherein the determining the at least one fluid frequency includes determining a first fluid frequency of a first portion of the turbine engine component and a second fluid frequency of a second portion of the turbine engine component, where the first fluid frequency and the second fluid frequency are different.

36. The method of any preceding clause, wherein the first fluid frequency or the second fluid frequency can be a resonate frequency of the first portion or the second portion or a harmonic of the resonate frequency of the first portion or the second portion.

37. The method of any preceding clause, wherein the pulsing fluid at the at least one fluid frequency includes pulsing fluid at the first fluid frequency and the second fluid frequency.

38. The method of any preceding clause, wherein the pulsing fluid at the at least one fluid frequency further includes pulsing fluid at the first fluid frequency and then pulsing fluid at the second fluid frequency after pulsing fluid at the first fluid frequency.

39. The method of any preceding clause, wherein the imaging further includes using the thermographic sensor to capture images at a first sampling frequency when the fluid is pulsed at the first fluid frequency and capture images at a second sampling frequency when the fluid is pulsed at the second fluid frequency.

40. The method of any preceding clause, further comprising generating, at a controller, thermographic data from the images of the turbine engine component taken at the first fluid frequency and the second fluid frequency.

41. The method of any preceding clause further comprising, calculating, at the controller, a performance score for the turbine engine component based on the thermographic data.

42. The method of any preceding clause, wherein the at least one fluid frequency of each pulse of the pulsing fluid is at least one of: between and including 10 Hertz to 20 Hertz, between and including 20 Hertz to 50 Hertz, between and including 50 Hertz to 100 Hertz, greater than 50 Hertz.

43. The method of any preceding clause, wherein the at least one sampling frequency is equal to or a multiple of the fluid frequency of each pulse of the pulsing fluid.

44. The method of any preceding clause, wherein a pulse duration of each pulse of the pulsing fluid is equal to or less than half of the inverse of the at least one fluid frequency.

45. The method of any preceding clause, wherein the thermographic sensor is an infrared camera and the at least one sampling frequency is an image capture rate of the infrared camera.

46. The method of any preceding clause, wherein a pulse duration of each pulse of the pulsing fluid is equal to or less than 2 second.

47. The method of any preceding clause, wherein the at least one fluid frequency is proportional to a thermal diffusivity of a portion of the turbine engine component, or is inversely proportional to a thickness of the portion of the turbine engine component.

What is claimed is:

1. A method of performance scoring airflow with an inspection system through a turbine engine test component having a first surface and a second surface spaced from the first surface, and a plurality of film holes with inlets formed in the second surface fluidly coupled to outlets formed in the first surface, the inspection system including a pump assembly fluidly coupled to the turbine engine test component, a controller, a thermographic sensor, and an output device, the method comprising:

flowing, using the pump assembly, airflow through the plurality of film holes of the turbine engine test component;

obtaining, using the thermographic sensor during the flowing airflow through the plurality of film holes, thermographic data for at least a subset of film holes of the plurality of film holes;

determining, using the controller, a temporal score based on the thermographic data;

determining, using the controller, a test dataset comprising test airflow values for the subset of film holes, wherein the test airflow values are determined by at least the temporal score;

calculating, using the controller, a difference between the test dataset and a reference dataset;

calculating, using the controller, a performance score for the turbine engine test component based on at least the difference; and outputting, using the output device, the performance score to at least one of accept the turbine engine test component, reject the turbine engine test component, or adjust design of the turbine engine test component.

2. The method of claim 1, wherein the thermographic data is a sequence of images capturing temperature fluctuations of areas in and/or around the subset of film holes for a predetermined length of time or predetermined number of airflow pulses.

3. The method of claim 1, wherein the temporal score is determined at a temporal module, wherein the temporal score is determined for each pixel of the thermographic data.

4. The method of claim 1, wherein the temporal score is determined at a temporal module, wherein the temporal score is determined for each pixel of the thermographic data associated with the subset of film holes.

5. The method of claim 4, further comprising determining a spatial score for the subset of film holes based on the thermographic data.

6. The method of claim 5, wherein the determining the spatial score is performed concurrently with calculating the temporal score includes for the subset of the plurality of film holes based on the thermographic data.

7. The method of claim 5, wherein the spatial score is determined at a spatial module, and wherein the determining the spatial score at the spatial module includes:

selecting a frame from the thermographic data or a normalized image determined by the temporal module;

selecting, based on orientation, location, or orientation and location of the component and a thermographic sensor, a reference image that represents the locations of the subset of film holes;

comparing pixels associated with the subset of film holes in the selected frame or the normalized image to the reference image; and determining, based on the comparing pixels associated with the subset of film holes, the spatial score.

8. The method of claim 1, further comprising determining a spatial score for the subset of film holes based on the thermographic data.

9. The method of claim 8, wherein the test airflow values are determined by at least the temporal score and the spatial score.

10. The method of claim 1, wherein the flowing airflow through the plurality of film holes includes determining at least one fluid frequency corresponding to at least one portion of the turbine engine test component.

11. The method of claim 10, wherein the flowing airflow includes pulsing fluid through the turbine engine test component with a pump assembly at the at least one fluid frequency.

12. The method of claim 11, wherein the pulsing fluid includes determining, based on the at least one fluid frequency, at least one sampling frequency.

13. The method of claim 12, wherein the obtaining, during the flowing airflow through the plurality of film holes, the thermographic data for at least the subset of film holes of the plurality of film holes includes a thermographic sensor obtaining the thermographic data at the at least one sampling frequency.

14. The method of claim 10, wherein the determining the at least one fluid frequency further comprises pulsing fluid through the at least a portion of the plurality of film holes of the turbine engine test component at multiple fluid frequencies.

15. The method of claim 14, wherein the pulsing fluid includes determining, based on the multiple fluid frequencies, a relative sampling frequency for each of the multiple fluid frequencies.

16. The method of claim 1, further comprising determining predetermined threshold values from one or more of design calculations, historic accumulated data, a reference database, or a reference part, where the reference part is known to be within accepted tolerances or tested using one or more additional inspection methods.

17. The method of claim 16, further comprising comparing the calculated performance score to the predetermined threshold values indicative of overperformance, acceptable performance, or underperformance of the turbine engine test component.

18. The method of claim 1, further comprising comparing the calculated performance score to a predetermined threshold value, wherein the comparing to the predetermined threshold value results in the adjusting design of the turbine engine test component, the accepting of the component, or the rejecting of the turbine engine test component.

19. The method of claim 18, wherein the adjusting the design of the turbine engine test component includes one or more of a change in design, manufacturing process, or materials used to form the turbine engine test component.

20. The method of claim 1, wherein the turbine engine test component is one of a blade, vane, strut, service tube, shroud, or a combustion liner.

* * * * *